US011119686B2

(12) United States Patent
Danilov et al.

(10) Patent No.: US 11,119,686 B2
(45) Date of Patent: Sep. 14, 2021

(54) PRESERVATION OF DATA DURING SCALING OF A GEOGRAPHICALLY DIVERSE DATA STORAGE SYSTEM

(71) Applicant: EMC IP Holding Company LLC, Hopkinton, MA (US)

(72) Inventors: Mikhail Danilov, Saint Petersburg (RU); Yohannes Altaye, Dumfries, VA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 5 days.

(21) Appl. No.: 16/399,902

(22) Filed: Apr. 30, 2019

(65) Prior Publication Data

US 2020/0348844 A1 Nov. 5, 2020

(51) Int. Cl.
*G06F 3/06* (2006.01)
*H03M 7/30* (2006.01)

(52) U.S. Cl.
CPC .............. *G06F 3/065* (2013.01); *G06F 3/067* (2013.01); *G06F 3/0608* (2013.01); *G06F 3/0659* (2013.01); *H03M 7/30* (2013.01)

(58) Field of Classification Search
None
See application file for complete search history.

(56) References Cited

U.S. PATENT DOCUMENTS

| 5,675,802 A | 10/1997 | Allen et al. |
| 5,805,788 A | 9/1998 | Johnson |
| 5,950,225 A | 9/1999 | Kleiman |
| 6,502,243 B1 | 12/2002 | Thomas |
| 7,389,393 B1 | 6/2008 | Karr et al. |
| 7,577,091 B2 | 8/2009 | Antal et al. |
| 7,631,051 B1 | 12/2009 | Fein et al. |
| 7,664,839 B1 | 2/2010 | Karr et al. |
| 7,680,875 B1 | 3/2010 | Shopiro et al. |

(Continued)

OTHER PUBLICATIONS

Non-Final Office Action received for U.S. Appl. No. 16/228,624 dated Jun. 24, 2020, 65 pages.

(Continued)

*Primary Examiner* — Denise Tran
(74) *Attorney, Agent, or Firm* — Amin, Turocy & Watson, LLP

(57) ABSTRACT

Preservation of data during scaling of a geographically diverse data storage system is disclosed. In regard to scaling-in, a first zone storage component (ZSC) can be placed in read-only (RO) mode to allow continued access to data stored on the first ZSC, completion of previously queued operations, updating of data chunks, etc. Data chunks can comprise metadata stored in directory table partitions organized in a tree data structure scheme. An updated data chunk of the first ZSC can be replicated at other ZSCs before deleting the first ZSC. A first hash function can be used to distribute portions of the updated data chunk among the other ZSCs. A second hash function can be used to distribute key data values corresponding to the distributed portions of the updated data chunk among the other ZSCs. Employing the first and second hash functions can result in more efficient use of storage space and more even distribution of key data values when compared to simple replication of a data chunk of the first ZSC by the other ZSCs.

20 Claims, 10 Drawing Sheets

(56) References Cited

U.S. PATENT DOCUMENTS

| | | |
|---|---|---|
| 7,721,044 B1 | 5/2010 | Chatterjee et al. |
| 8,125,406 B1 | 2/2012 | Jensen et al. |
| 8,261,033 B1* | 9/2012 | Slik ..................... G06F 3/0647 |
| | | 711/162 |
| 8,370,542 B2 | 2/2013 | Lu et al. |
| 8,479,037 B1 | 7/2013 | Chatterjee et al. |
| 8,495,465 B1 | 7/2013 | Anholt et al. |
| 8,540,625 B2 | 9/2013 | Miyoshi |
| 8,683,205 B2 | 3/2014 | Resch et al. |
| 8,751,599 B2 | 6/2014 | Tran et al. |
| 8,751,740 B1 | 6/2014 | De Forest et al. |
| 8,751,897 B2 | 6/2014 | Borthakur et al. |
| 8,799,746 B2 | 8/2014 | Baker et al. |
| 8,832,234 B1 | 9/2014 | Brooker et al. |
| 8,856,619 B1 | 10/2014 | Cypher |
| 8,856,624 B1 | 10/2014 | Paniconi |
| 8,972,478 B1 | 3/2015 | Storer et al. |
| 9,003,086 B1 | 4/2015 | Schuller et al. |
| 9,021,296 B1 | 4/2015 | Kiselev et al. |
| 9,037,825 B1 | 5/2015 | Donlan et al. |
| 9,052,942 B1 | 6/2015 | Barber et al. |
| 9,063,838 B1 | 6/2015 | Boyle et al. |
| 9,098,447 B1 | 8/2015 | Donlan et al. |
| 9,208,009 B2 | 12/2015 | Resch et al. |
| 9,218,135 B2 | 12/2015 | Miller et al. |
| 9,244,761 B2 | 1/2016 | Yekhanin et al. |
| 9,268,783 B1 | 2/2016 | Shilane et al. |
| 9,274,903 B1 | 3/2016 | Garlapati et al. |
| 9,280,430 B2 | 3/2016 | Sarfare et al. |
| 9,405,483 B1 | 8/2016 | Wei et al. |
| 9,477,682 B1 | 10/2016 | Bent et al. |
| 9,495,241 B2 | 11/2016 | Flynn et al. |
| 9,619,256 B1 | 4/2017 | Natanzon et al. |
| 9,641,615 B1 | 5/2017 | Robins et al. |
| 9,665,428 B2 | 5/2017 | Vairavanathan et al. |
| 9,747,057 B1 | 8/2017 | Ramani et al. |
| 9,817,713 B2 | 11/2017 | Gupta et al. |
| 9,864,527 B1 | 1/2018 | Srivastav et al. |
| 9,942,084 B1 | 4/2018 | Sorenson, III |
| 10,001,947 B1 | 6/2018 | Chatterjee et al. |
| 10,007,561 B1 | 6/2018 | Pudipeddi et al. |
| 10,055,145 B1 | 8/2018 | Danilov et al. |
| 10,061,668 B1 | 8/2018 | Lazier et al. |
| 10,108,819 B1 | 10/2018 | Donlan et al. |
| 10,127,234 B1 | 11/2018 | Krishnan et al. |
| 10,216,770 B1 | 2/2019 | Kulesza et al. |
| 10,242,022 B1 | 3/2019 | Jain et al. |
| 10,282,262 B2 | 5/2019 | Panara et al. |
| 10,289,488 B1 | 5/2019 | Danilov et al. |
| 10,331,516 B2 | 6/2019 | Danilov et al. |
| 10,361,810 B2 | 7/2019 | Myung et al. |
| 10,387,546 B1 | 8/2019 | Duran et al. |
| 10,496,330 B1 | 12/2019 | Bernat et al. |
| 10,503,611 B1 | 12/2019 | Srivastav et al. |
| 10,567,009 B2 | 2/2020 | Yang et al. |
| 10,579,490 B2 | 3/2020 | Danilov et al. |
| 10,613,780 B1 | 4/2020 | Naeni et al. |
| 10,644,408 B2 | 5/2020 | Sakai et al. |
| 10,705,911 B2 | 7/2020 | Vishnumolakala et al. |
| 10,733,053 B1 | 8/2020 | Miller et al. |
| 10,740,183 B1 | 8/2020 | Blaum et al. |
| 10,797,863 B2 | 10/2020 | Chen et al. |
| 10,846,003 B2 | 11/2020 | Danilov et al. |
| 2002/0166026 A1 | 11/2002 | Ulrich et al. |
| 2002/0191311 A1 | 12/2002 | Ulrich et al. |
| 2005/0080982 A1 | 4/2005 | Vasilevsky et al. |
| 2005/0088318 A1 | 4/2005 | Liu et al. |
| 2005/0108775 A1 | 5/2005 | Bachar et al. |
| 2005/0140529 A1 | 6/2005 | Choi et al. |
| 2005/0234941 A1 | 10/2005 | Watanabe |
| 2006/0047896 A1 | 3/2006 | Nguyen et al. |
| 2006/0075007 A1 | 4/2006 | Anderson et al. |
| 2006/0143508 A1 | 6/2006 | Mochizuki et al. |
| 2006/0265211 A1 | 11/2006 | Canniff et al. |
| 2007/0076321 A1 | 4/2007 | Takahashi et al. |
| 2007/0239759 A1 | 10/2007 | Shen et al. |
| 2007/0250674 A1 | 10/2007 | Findberg et al. |
| 2008/0222480 A1 | 9/2008 | Huang et al. |
| 2008/0222481 A1 | 9/2008 | Huang et al. |
| 2008/0244353 A1 | 10/2008 | Dholakia et al. |
| 2008/0320061 A1 | 12/2008 | Aszmann et al. |
| 2009/0070771 A1 | 3/2009 | Yuyitung et al. |
| 2009/0113034 A1 | 4/2009 | Krishnappa et al. |
| 2009/0172464 A1 | 7/2009 | Byrne et al. |
| 2009/0183056 A1 | 7/2009 | Aston |
| 2009/0204959 A1 | 8/2009 | Anand et al. |
| 2009/0240880 A1 | 9/2009 | Kawaguchi |
| 2009/0259882 A1 | 10/2009 | Shellhamer |
| 2010/0031060 A1 | 2/2010 | Chew et al. |
| 2010/0094963 A1 | 4/2010 | Zuckerman et al. |
| 2010/0174968 A1 | 7/2010 | Charles et al. |
| 2010/0218037 A1 | 8/2010 | Swartz et al. |
| 2010/0293348 A1 | 11/2010 | Ye et al. |
| 2010/0332748 A1 | 12/2010 | Van der Goot et al. |
| 2011/0029836 A1 | 2/2011 | Dhuse et al. |
| 2011/0106972 A1 | 5/2011 | Grube et al. |
| 2011/0107165 A1 | 5/2011 | Resch et al. |
| 2011/0138148 A1 | 6/2011 | Friedman et al. |
| 2011/0161712 A1* | 6/2011 | Athalye ................ G06F 1/3203 |
| | | 713/340 |
| 2011/0196833 A1 | 8/2011 | Drobychev et al. |
| 2011/0246503 A1 | 10/2011 | Bender et al. |
| 2011/0292054 A1 | 12/2011 | Boker et al. |
| 2012/0023291 A1 | 1/2012 | Zeng et al. |
| 2012/0096214 A1 | 4/2012 | Lu et al. |
| 2012/0191675 A1 | 7/2012 | Kim et al. |
| 2012/0191901 A1 | 7/2012 | Norair |
| 2012/0204077 A1 | 8/2012 | D'Abreu et al. |
| 2012/0233117 A1 | 9/2012 | Holt et al. |
| 2012/0311395 A1 | 12/2012 | Leggette et al. |
| 2012/0317234 A1 | 12/2012 | Bohrer et al. |
| 2012/0321052 A1 | 12/2012 | Morrill et al. |
| 2013/0047187 A1 | 2/2013 | Frazier et al. |
| 2013/0054822 A1 | 2/2013 | Mordani et al. |
| 2013/0067159 A1 | 3/2013 | Mehra |
| 2013/0067187 A1 | 3/2013 | Moss et al. |
| 2013/0088501 A1 | 4/2013 | Fell |
| 2013/0097470 A1 | 4/2013 | Hwang et al. |
| 2013/0145208 A1 | 6/2013 | Yen et al. |
| 2013/0238932 A1 | 9/2013 | Resch |
| 2013/0246876 A1 | 9/2013 | Manssour et al. |
| 2013/0290482 A1 | 10/2013 | Leggette |
| 2013/0305365 A1 | 11/2013 | Rubin et al. |
| 2014/0040417 A1 | 2/2014 | Galdwin et al. |
| 2014/0064048 A1 | 3/2014 | Cohen et al. |
| 2014/0115182 A1 | 4/2014 | Sabaa et al. |
| 2014/0164430 A1 | 6/2014 | Hadjieleftheriou et al. |
| 2014/0164694 A1 | 6/2014 | Storer |
| 2014/0250450 A1 | 9/2014 | Yu et al. |
| 2014/0280375 A1 | 9/2014 | Rawson et al. |
| 2014/0281804 A1 | 9/2014 | Resch |
| 2014/0297955 A1 | 10/2014 | Yamazaki et al. |
| 2014/0331100 A1 | 11/2014 | Dhuse et al. |
| 2014/0358972 A1 | 12/2014 | Guarrieri et al. |
| 2014/0359244 A1 | 12/2014 | Chambliss et al. |
| 2014/0380088 A1 | 12/2014 | Bennett et al. |
| 2014/0380125 A1 | 12/2014 | Calder et al. |
| 2014/0380126 A1 | 12/2014 | Yekhanin et al. |
| 2015/0006846 A1 | 1/2015 | Youngworth |
| 2015/0074065 A1 | 3/2015 | Christ et al. |
| 2015/0112951 A1 | 4/2015 | Narayanamurthy et al. |
| 2015/0134626 A1 | 5/2015 | Theimer et al. |
| 2015/0142863 A1 | 5/2015 | Yuen et al. |
| 2015/0178007 A1 | 6/2015 | Moisa et al. |
| 2015/0186043 A1 | 7/2015 | Kesselman et al. |
| 2015/0269025 A1 | 9/2015 | Krishnamurthy et al. |
| 2015/0303949 A1 | 10/2015 | Jafarkhani et al. |
| 2015/0331766 A1 | 11/2015 | Sarfare et al. |
| 2015/0370656 A1 | 12/2015 | Tsafrir et al. |
| 2015/0378542 A1 | 12/2015 | Saito et al. |
| 2016/0011935 A1 | 1/2016 | Luby |
| 2016/0011936 A1 | 1/2016 | Luby |
| 2016/0055054 A1 | 2/2016 | Patterson, III et al. |
| 2016/0162378 A1 | 6/2016 | Garlapati et al. |

(56) References Cited

U.S. PATENT DOCUMENTS

| | | |
|---|---|---|
| 2016/0169692 A1 | 6/2016 | Gupta |
| 2016/0170668 A1 | 6/2016 | Mehra |
| 2016/0217104 A1 | 7/2016 | Kamble et al. |
| 2016/0232055 A1 | 8/2016 | Vairavanathan et al. |
| 2016/0253400 A1* | 9/2016 | McAlister ............ G06F 11/2076 707/634 |
| 2016/0277497 A1 | 9/2016 | Bannister et al. |
| 2016/0292429 A1 | 9/2016 | Bannister et al. |
| 2016/0294419 A1 | 10/2016 | Sandell et al. |
| 2016/0328295 A1 | 11/2016 | Baptist et al. |
| 2016/0357443 A1 | 12/2016 | Li et al. |
| 2016/0357649 A1 | 12/2016 | Karrotu et al. |
| 2016/0371145 A1 | 12/2016 | Akutsu et al. |
| 2016/0378624 A1 | 12/2016 | Jenkins, Jr. et al. |
| 2016/0380650 A1 | 12/2016 | Calder et al. |
| 2017/0003880 A1 | 1/2017 | Fisher et al. |
| 2017/0004044 A1 | 1/2017 | Tormasov et al. |
| 2017/0017671 A1 | 1/2017 | Baptist et al. |
| 2017/0031945 A1 | 2/2017 | Sarab et al. |
| 2017/0097875 A1 | 4/2017 | Jess et al. |
| 2017/0102993 A1 | 4/2017 | Hu et al. |
| 2017/0116088 A1 | 4/2017 | Anami et al. |
| 2017/0187398 A1 | 6/2017 | Trusov |
| 2017/0187766 A1 | 6/2017 | Zheng et al. |
| 2017/0206025 A1 | 7/2017 | Viswanathan |
| 2017/0206135 A1 | 7/2017 | Zeng |
| 2017/0212680 A1 | 7/2017 | Waghulde |
| 2017/0212845 A1 | 7/2017 | Conway |
| 2017/0235507 A1 | 8/2017 | Sinha et al. |
| 2017/0262187 A1 | 9/2017 | Manzanares et al. |
| 2017/0268900 A1 | 9/2017 | Nicolaas et al. |
| 2017/0285952 A1 | 10/2017 | Danilov et al. |
| 2017/0286009 A1 | 10/2017 | Danilov et al. |
| 2017/0286436 A1 | 10/2017 | Neporada et al. |
| 2017/0286516 A1 | 10/2017 | Horowitz et al. |
| 2017/0288701 A1 | 10/2017 | Slik et al. |
| 2017/0344285 A1 | 11/2017 | Choi et al. |
| 2018/0052744 A1 | 2/2018 | Chen et al. |
| 2018/0063213 A1 | 3/2018 | Bevilacqua-Linn et al. |
| 2018/0074881 A1 | 3/2018 | Burden |
| 2018/0121286 A1 | 5/2018 | Sipos |
| 2018/0129417 A1 | 5/2018 | Sivasubramanian et al. |
| 2018/0181324 A1 | 6/2018 | Danilov et al. |
| 2018/0181475 A1 | 6/2018 | Danilov et al. |
| 2018/0181612 A1 | 6/2018 | Danilov et al. |
| 2018/0246668 A1 | 8/2018 | Sakashita et al. |
| 2018/0267856 A1 | 9/2018 | Hayasaka et al. |
| 2018/0267985 A1 | 9/2018 | Badey et al. |
| 2018/0306600 A1 | 10/2018 | Nicolaas et al. |
| 2018/0307560 A1 | 10/2018 | Vishnumolakala et al. |
| 2018/0341662 A1 | 11/2018 | He |
| 2018/0375936 A1 | 12/2018 | Chirammal et al. |
| 2019/0028179 A1 | 1/2019 | Kalhan |
| 2019/0034084 A1 | 1/2019 | Nagarajan et al. |
| 2019/0043201 A1 | 2/2019 | Strong et al. |
| 2019/0043351 A1 | 2/2019 | Yang et al. |
| 2019/0050301 A1 | 2/2019 | Juniwal et al. |
| 2019/0065092 A1 | 2/2019 | Shah et al. |
| 2019/0065310 A1 | 2/2019 | Rozas |
| 2019/0114223 A1 | 4/2019 | Pydipaty et al. |
| 2019/0205437 A1 | 7/2019 | Larson et al. |
| 2019/0215017 A1 | 7/2019 | Danilov et al. |
| 2019/0220207 A1 | 7/2019 | Lingarajappa |
| 2019/0356416 A1 | 11/2019 | Yanovsky et al. |
| 2019/0384500 A1 | 12/2019 | Danilov et al. |
| 2019/0386683 A1 | 12/2019 | Danilov et al. |
| 2020/0026810 A1 | 1/2020 | Subramaniam et al. |
| 2020/0042178 A1 | 2/2020 | Danilov et al. |
| 2020/0050510 A1 | 2/2020 | Chien et al. |
| 2020/0104377 A1 | 4/2020 | Earnesty, Jr. et al. |
| 2020/0117556 A1 | 4/2020 | Zou et al. |

OTHER PUBLICATIONS

Non-Final Office Action received for U.S. Appl. No. 16/240,272 dated Jun. 29, 2020, 64 pages.

Non-Final Office Action received for U.S. Appl. No. 16/228,612 dated Jun. 29, 2020, 62 pages.

Final Office Action received for U.S. Appl. No. 16/010,255 dated Jul. 23, 2020, 36 pages.

Office Action received for U.S. Appl. No. 16/010,246 dated Jul. 27, 2020 36 pages.

Office Action received for U.S. Appl. No. 16/177,278, dated Aug. 21, 2020, 53 pages.

Office Action received for U.S. Appl. No. 16/179,486, dated Aug. 13, 2020, 64 pages.

Guo et al., "GeoScale: Providing Geo-Elasticity in Distributed Clouds" 2016 IEEE International Conference on Cloud Engineering, 4 pages.

Guo et al., "Providing Geo-Elasticity in Geographically Distributed Clouds". ACM Transactions on Internet Technology, vol. 18, No. 3, Article 38. Apr. 2018. 27 pages.

Office Action received for U.S. Appl. No. 16/254,073, dated Aug. 18, 2020, 62 pages.

Wikipedia, "Standard Raid Levels—RAID 6", URL: https://en.wikipedia.org/wiki/Standard_RAID_levels#RAID_6, Oct. 18, 2019, 11 pages.

Non-Final Office Action received for U.S. Appl. No. 15/656,382 dated Nov. 1, 2019, 47 pages.

Final Office Action received for U.S. Appl. No. 15/952,179 dated Nov. 26, 2019, 53 pages.

Non Final Office Action received for U.S. Appl. No. 16/024,314 dated Nov. 25, 2019, 42 pages.

Non-Final Office Action received for U.S. Appl. No. 16/177,278 dated Dec. 2, 2019, 55 pages.

Non-Final Office Action received for U.S. Appl. No. 15/651,504 dated Dec. 31, 2019, 18 pages.

Non-Final Office Action received for U.S. Appl. No. 16/010,246 dated Dec. 5, 2019, 67 pages.

Stonebreaker et al. "Distributed RAID—A New Multiple Copy Algorithm.", IEEE ICDE, 1990, pp. 430-437.

Muralidhar et al. "f4: Facebook's Warm BLOB Storage System", USENIX. OSDI, Oct. 2014, pp. 383-398.

Final Office Action dated Feb. 12, 2020 for U.S. Appl. No. 16/024,314, 29 pages.

Office Action dated Jan. 9, 2020 for U.S. Appl. No. 16/010,255, 31 pages.

Office Action dated Feb. 5, 2020 for U.S. Appl. No. 16/261,551, 30 pages.

Non-Final Office Action received for U.S. Appl. No. 16/209,185 dated Jun. 18, 2020, 22 pages.

Martin Hosken, Developing a Hyper-Converged Storage Strategy for VMware vCloud Director with VMware vSAN, Jan. 2018 (Year: 2018).

Non-Final Office Action received for U.S. Appl. No. 16/261,549 dated Apr. 15, 2020, 22 pages.

Non-Final Office Action received for U.S. Appl. No. 16/374,726 dated Jun. 2, 2020, 47 pages.

Natarajan, RAID 0, RAID 1, RAID 5, RAID 10 Explained with Diagrams, Aug. 10, 2010, thegeekstuff.com (18 pages).

Non-Final Office Action received for U.S. Appl. No. 16/177,285 dated Jul. 22, 2020, 31 pages.

Non-Final Office Action received for U.S. Appl. No. 16/261,547 dated Sep. 3, 2020, 26 pages.

Non-Final Office Action received for U.S. Appl. No. 16/261,548 dated Aug. 21, 2020, 42 pages.

Notice of Allowance received for U.S. Appl. No. 16/261,549 dated Jul. 17, 2020, 40 pages.

Qiang et al., "Dynamics Process of Long-running Allocation/Collection in Linear Storage Space", International Conference on Networking, Architecture, and Storage (NAS 2007), Guilin, 2007, pp. 209-216.

Non-Final Office Action received for U.S. Appl. No. 16/374,725 dated Aug. 19, 2020, 50 pages.

Non-Final Office Action received for U.S. Appl. No. 16/511,161 dated Jul. 10, 2020, 24 pages.

(56) References Cited

OTHER PUBLICATIONS

Notice of Allowance received for U.S. Appl. No. 15/862,547 dated Mar. 29, 2019 27 pages.
Non-Final Office Action received for U.S. Appl. No. 15/792,714 dated Apr. 4, 2019, 20 pages.
Final Office Action received for U.S. Appl. No. 15/792,714 dated Sep. 12, 2019, 43 pages.
Wikipedia "Garbage Collection", URL: https://en.wikipedia.org/wiki/Garbage_collection_(computer science)#Availability (Year: 2017) retrieved using the WayBackMachine, Sep. 8, 2017, 8 pages.
Wikipedia "Erasure code", URL: https://web.archive.org/web/20170908171158/https://en.wikipedia.org/wiki/Erasure_code (Year: 2017), retrieved using the WayBackMachine, Sep. 8, 2017, 5 pages.
Wikipedia "Front and back ends" URL: https://en.wikipedia.org/wiki/Front_and_back_ends (Year:2019), Sep. 6, 2019, 4 pages.
Notice of Allowance received for U.S. Appl. No. 15/792,714 dated Nov. 8, 2019, 31 pages.
Non-Final Office Action received for U.S. Appl. No. 15/791,390 dated Sep. 20, 2019, 27 pages.
Final Office Action received for U.S. Appl. No. 15/791,390 dated Feb. 6, 2020, 29 pages.
Non-Final Office Action received for U.S. Appl. No. 15/791,390 dated Apr. 30, 2020, 48 pages.
Huang et al., "Scale-RS: An Efficient Scaling Scheme for RS-Coded Storage Clusters," in IEEE Transactions on Parallel and Distributed Systems, vol. 26, No. 6, pp. 1704-1717, Jun. 1, 2015.
Non-Final Office Action received for U.S. Appl. No. 16/457,615 dated Jul. 20, 2020, 34 pages.
Non-Final Office Action received for U.S. Appl. No. 16/228,612 dated Feb. 27, 2020, 49 pages.
Final Office Action received for U.S. Appl. No. 16/010,246 dated Mar. 16, 2020, 33 pages.
Final Office Action received for U.S. Appl. No. 15/656,382 dated Apr. 6, 2020, 31 pages.
Non-Final Office Action received for U.S. Appl. No. 15/582,167 dated Sep. 7, 2018, 19 pages.
Non-Final Office Action received for U.S. Appl. No. 15/952,179 dated Apr. 20, 2020, 68 pages.
Notice of Allowance dated May 4, 2020 for U.S. Appl. No. 16/240,193, 46 pages.
Office Action dated May 11, 2020 for U.S. Appl. No. 16/177,278, 53 pages.
Office Action dated May 8, 2020 for U.S. Appl. No. 16/231,018, 78 pages.
Notice of Allowance dated May 11, 2020 for U.S. Appl. No. 16/240,193, 24 pages.
Non-Final Office Action received for U.S. Appl. No. 15/651,504 dated Mar. 21, 2019, 10 pages.
Non-Final Office Action received for U.S. Appl. No. 15/662,273 dated Nov. 16, 2018, 19 pages.
Final Office Action received for U.S. Appl. No. 15/662,273 dated May 15, 2019, 33 pages.
Non-Final Office Action received for U.S. Appl. No. 15/965,479 dated Apr. 15, 2019, 21 pages.
Non-Final Office Action received for U.S. Appl. No. 15/794,950 dated Jul. 9, 2019, 29 pages.
Final Office Action received for U.S. Appl. No. 15/651,504 dated Sep. 18, 2019, 15 pages.
Non-Final Office Action received for U.S. Appl. No. 15/952,179 dated Sep. 10, 2019, 42 pages.
Non-Final Office Action received for U.S. Appl. No. 16/526,142 dated Oct. 15, 2020, 21 pages.
Notice of Allowance received U.S. Appl. No. 16/228,612 dated Oct. 20, 2020, 84 pages.
Zhou, et al. "Fast Erasure Coding for Data Storage: A Comprehensive Study of the Acceleration Techniques" Proceedings of the 17th Usenix Conference on File and Storage Technologies (FAST '19), [https://www.usenix.org/conference/fast19/presentation/zhou], Feb. 2019, Boston, MA, USA. 14 pages.
Non-Final Office Action received for U.S. Appl. No. 16/010,255 dated Oct. 29, 2020, 65 pages.
Final Office Action received for U.S. Appl. No. 16/240,272 dated Oct. 27, 2020, 42 pages.
Notice of Allowance received for U.S. Appl. No. 16/374,726 dated Nov. 20, 2020, 78 pages.
Final Office Action received for U.S. Appl. No. 16/228,624 dated Dec. 1, 2020, 63 pages.
Non-Final Office Action received for U.S. Appl. No. 16/570,657 dated Nov. 27, 2020, 75 pages.
Final Office Action received for U.S. Appl. No. 16/177,285 dated Dec. 30, 2020, 61 pages.
Final Office Action received for U.S. Appl. No. 16/511,161 dated Dec. 30, 2020, 61 pages.
Non-Final Office Action received for U.S. Appl. No. 16/399,895 dated Jan. 4, 2021, 64 pages.
Notice of Allowance received for U.S. Appl. No. 16/374,726 dated Jan. 6, 2021, 56 pages.
Notice of Allowance dated Jun. 14, 2021 for U.S. Appl. No. 16/726,428, 34 pages.
Office Action dated May 24, 2021 for U.S. Appl. No. 16/698,096, 63 pages.
Office Action dated May 13, 2021 for U.S. Appl. No. 16/745,855, 72 pages.
Office Action dated Jun. 24, 2021 for U.S. Appl. No. 16/834,649, 61 pages.
Office Action dated May 12, 2021 for U.S. Appl. No. 16/179,486, 50 pages.
Office Action dated May 12, 2021 for U.S. Appl. No. 16/570,657, 79 pages.
Office Action dated Jul. 20, 2021 for U.S. Appl. No. 16/670,765, 82 pages.
Thomasian, Alexander et al., "Hierarchical RAID: Design, performance, reliability, and recovery", 2012, Elsevier Inc. (Year: 2012), 17 pages.
Non-Final Office Action received for U.S. Appl. No. 16/399,897 dated Feb. 19, 2021, 56 pages.
Non-Final Office Action received for U.S. Appl. No. 16/670,715 dated Mar. 31, 2021, 60 pages.
Final Office Action received for U.S. Appl. No. 16/177,278 dated Feb. 24, 2021, 109 pages.
EMC; "EMC ECS (Elastic Cloud Storage) Architectural Guide v2.x;" EMC; Jun. 2015; available at: https://www.dell.com/community/s/vjauj58549/attachments/vjauj58549/solutions-ch/477/1/h14071-ecs-architectural-guide-wp.pdf, Jun. 2015, 21 pages.
Mohan et al., "Geo-aware erasure coding for high-performance erasure-coded storage clusters", Springer Link, URL:https://link.springer.com/article/10.1007/s 12243-017-0623-2, Jan. 18, 2018.
Final Office Action received for U.S. Appl. No. 16/179,486 dated Jan. 28, 2021, 55 pages.
Non-Final Office Action received for U.S. Appl. No. 16/670,746 dated Feb. 16, 2021, 55 pages.
Dell Technologies, "ECS Overview and Architecture", h14071.18, Feb. 2021, 21 Pages.
Non-Final Office Action received for U.S. Appl. No. 16/177,285 dated Apr. 9, 2021, 41 pages.
Non-Final Office Action received for U.S. Appl. No. 16/779,208 dated Apr. 20, 2021, 71 pages.

* cited by examiner

PRESERVATION OF DATA DURING SCALING OF A GEOGRAPHICALLY DIVERSE DATA STORAGE SYSTEM

TECHNICAL FIELD

The disclosed subject matter relates to preservation of data during scaling of a zone-based data storage system, more particularly, to protecting data during scaling of a geographically diverse data storage system, e.g., scaling-in or scaling-out of a geographically diverse data storage system without loss of data, more particularly directory table data that can be stored in tree data structures.

BACKGROUND

Conventional data storage techniques can employ convolution and deconvolution of data to conserve storage space. As an example, convolution can allow data to be packed or hashed in a manner that uses less space that the original data. Moreover, convolved data, e.g., a convolution of first data and second data, etc., can typically be de-convoluted to the original first data and second data. One use of data storage is in bulk data storage. Additionally, stored data can be protected via distribution of replicates of chunks in different zones of a zone based storage system. Typically, zones can be remote from each other to provide protection of data stored in the several zones, e.g., an event that can impact in a first zone at a first geographical area may not affect a second zone at a second geographical area, for example, an earthquake in Seattle that affects a first zone of a geographically diverse data storage system may not affect a second zone of the geographically diverse data storage system located in Miami, wherein a replicate of Seattle data stored in Miami can be recovered to replace damaged data resulting from the example earthquake in Seattle.

DETAILED DESCRIPTION

Figure 1:
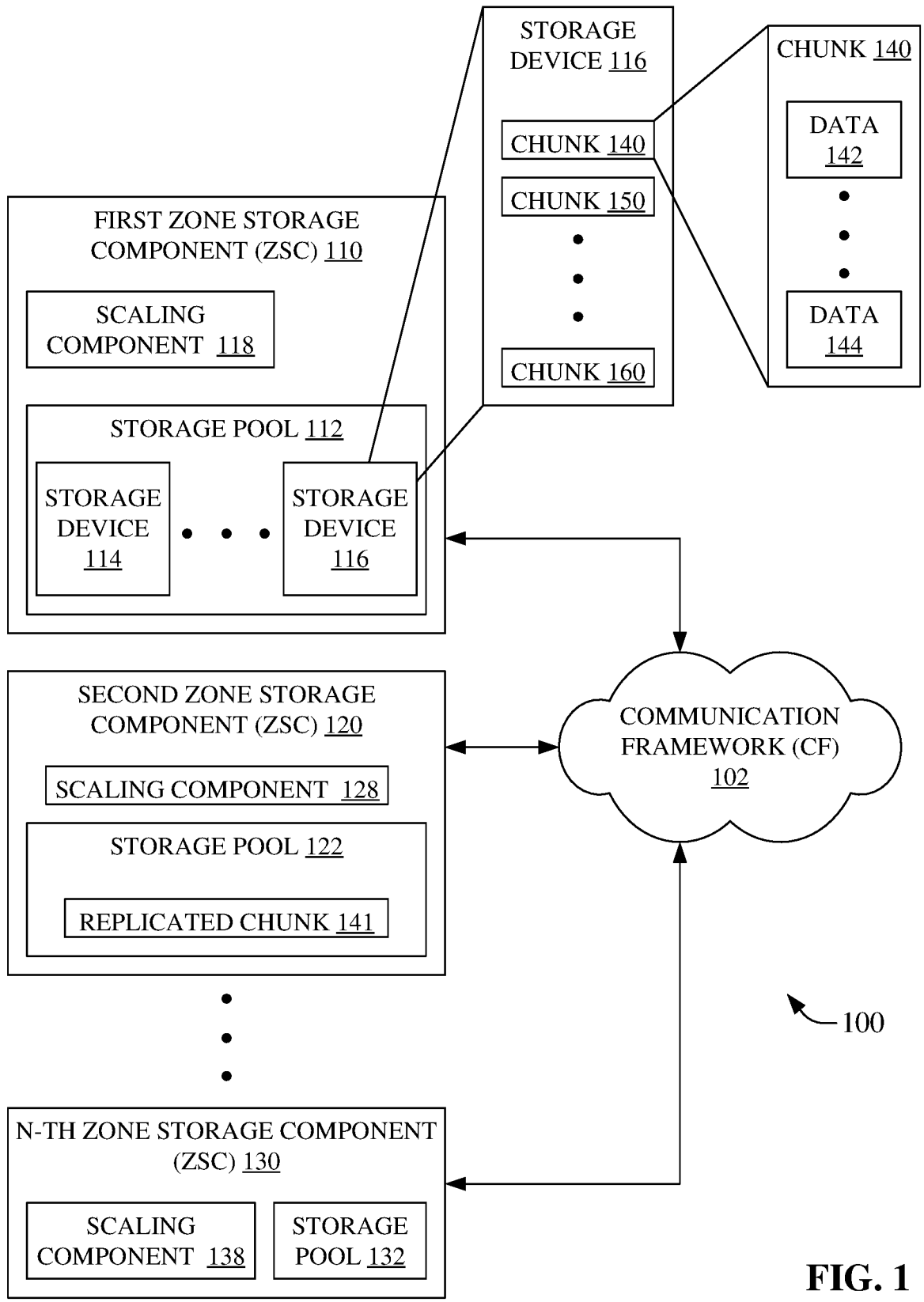
FIG. 1 is an illustration of an example system that can facilitate preserving data during scaling of a geographically diverse storage system, in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

As mentioned, data storage techniques can employ convolution and deconvolution to conserve storage space. As an example, convolution can allow data to be packed or hashed in a manner that uses less space that the original data. Moreover, convolved data, e.g., a convolution of first data and second data, etc., can typically be de-convoluted to the original first data and second data. One use of data storage is in bulk data storage. Examples of bulk data storage can include networked storage, e.g., cloud storage, for example ECS offered by Dell EMC, formerly known as Elastic Cloud Storage. Bulk storage can, in an aspect, manage disk capacity via partitioning of disk space into blocks of fixed size, frequently referred to as data chunks, chunks, etc., for example a 128 MB chunk, etc. Chunks can be used to store user data, and the chunks can be shared among the same or different users, for example, one chunk may contain fragments of several user objects. A chunk's content can generally be modified in an append-only mode to prevent overwriting of data already added to the chunk. As such, when a typical chunk is determined to be 'full enough,' it can be sealed so that the data therein is generally not available for further modification, e.g., the chunk can designated as immutable. These chunks can be then stored in a geographically diverse manner to allow for recovery of the data where a first copy of the data is destroyed, e.g., disaster recovery, etc. Chunks from a data storage device, e.g., 'zone storage component' (ZSC), 'zone storage device' (ZSD), etc., located in a first geographic location, hereinafter a 'zone', etc., can be stored in a second zone storage device that is located at a second geographic location different from the first geographic location. This can enable recovery of data where the first zone storage device is damaged, destroyed, offline, etc., e.g., disaster recovery of data, by accessing the off-site data from the second zone storage device.

Geographically diverse data storage can use data compression to store data. As an example, a storage device in Topeka can store a backup of data from a first zone storage device in Houston, e.g., Topeka can be considered geographically diverse from Houston. As a second example, data chunks from Seattle and San Jose can be stored in Denver. The example Denver storage can be compressed or uncompressed, wherein uncompressed indicates that the Seattle and San Jose chunks are replicated in Denver, and wherein compressed indicates that the Seattle and San Jose chunks are convolved in Denver, for example via an 'XOR' operation, into a different chunk, e.g., a convolved chunk, to allow recovery of the Seattle or San Jose data from the convolved chunk, but where the convolved chunk typically consumes less storage space in Denver than the sum of the storage space for both the Seattle and San Jose chunks individually in Denver. In an aspect, compression can comprise convolving data and decompression can comprise deconvolving data, hereinafter the terms compress, compression, convolve, convolving, etc., can be employed interchangeably unless explicitly or implicitly contraindicated, and similarly, decompress, decompression, deconvolve, deconvolving, etc., can be used interchangeably unless explicitly or implicitly contraindicated. Compression, therefore, can allow original data to be recovered from a compressed chunk that consumes less storage space than storage of the uncompressed data chunks. This can be beneficial in that data from a location can be backed up by redundant data in another location via a compressed chunk, wherein a redundant data chunk can be smaller than the sum of the data chunks contributing to the compressed chunk. As such, local chunks, e.g., chunks from different zone storage devices, can be compressed via a convolution technique to reduce the amount of storage space used at a geographically distinct location.

Chunks can also be employed to store data other than user-generated data, e.g., metadata, etc. In an aspect, user-generated data can be stored in "repository chunks." Other types of data can be stored in other types of chunks, for example, metadata can be embodied in directory tables (DTs) that can be stored in storage partitions implemented as tree-like or tree data structures that can be stored in "tree chunks." In an embodiment, a DT can comprise 128 partitions, as can be employed in ECS, etc. In an embodiment, a hash function can be used to derive a home partition for a key value. A tree-like or tree data structure, hereinafter 'tree' or similar term, storing DT data according to a hash function can be associated with a journal of updates, e.g., as metadata evolves, a journal can record corresponding changes to the tree such that given a starting tree and a journal, a current state of the metadata can be arrived at. Journal updates can be stored in "journal chunks." In an aspect, trees and journals can be distributed among zones of a geographically diverse data storage system to provide resilience against loss of metadata in a manner similar to protecting repository chunks. In an aspect, an updated tree can be based on a previous tree and journal, wherein, upon creation of the updated tree, the previous tree and journal can be deleted, released, etc., to conserve memory usage. In an aspect, some, none, or all, intermediate trees/journals can be preserved. In an example, a base tree and every intermediate tree and journal can be preserved, though this can be memory intensive. In another example, only a most recent tree and journal can be preserved, which can be less memory intensive in contrast to preserving more intermediate trees, etc. In a third example, a selected number of most recent tree iterations and journals can be preserved. In a further aspect, chunks can store data of several objects, e.g., a repository chunk can comprise user-generated data from different users, a tree chunk can comprise tree data for different trees, etc.

In an aspect, ECS, for example, can be an object storage system. ECS can employ proprietary databases to store system and user metadata in addition to user-generated data, etc. In an embodiment, ECS can implement data structures called Directory Tables (DTs) to store metadata. ECS can benefit from employing a geographically distributed data storage system, e.g., a data storage system comprising two or more zones that can be geographically diverse, for example located in radically different locations. The geographically diverse storage of data can facilitate synchronization of DTs maintained by different zones, for example, using a low-level replication mechanism. In an aspect, scaling, e.g., scaling-out, adding a zone to a geographically diverse data storage system, scaling-in, e.g., removing a zone, etc., can involve replication of chunks rather than data objects. The instant disclosure proposes a safe and resource efficient method to scale geographically diverse data storage systems in a manner than protects data, more especially metadata stored in DTs, although other types of data, chunks, etc., can benefit from the disclosed subject matter. Accordingly, the disclosed subject matter is discussed generally in terms of protecting metadata stored via DTs in a geographically diverse storage system, but the disclosed subject matter is not limited to the explicitly recited examples.

In an embodiment of the disclosed subject matter, metadata can be stored in DTs, where each DT can comprise a set of partitions, for example, 128 partitions. A hash function can be used to derive a home partition for a given key, and the DT partitions can be implemented as tree data structures, e.g., trees. These trees can be stored in tree chunks. Each tree can be correlated to a journal of tree updates, e.g., journals. These journals can be stored in journal chunks. Chunks of a type can be shared to store the corresponding type of data from different sources, for example, one repository chunk can contain portions of different user-generated data objects, one tree chunk can contain elements of different trees, etc. ECS can, for example, implement bulk tree update techniques to reduce a total cost of updates, e.g., less monetary cost, computer resource cost, manpower cost, etc., in comparison to individual tree updates. An example system can keep an effective or current state of a tree, e.g., a state that takes into account changes in the tree occurring since a previous state of the tree, which changes can be reflected in the corresponding tree journal. The effective state, in some embodiments, can be stored in a volatile memory, e.g., in a memory table, etc. In an embodiment, a memory table can be 'dumped', e.g., written, to a non-volatile memory as a new version of a tree, and corresponding journal chunks can then be deleted because the changes represented in the journal data are now reflected in the new version of the tree data. In an embodiment, ECS can replicate repository chunks comprising user-generated data and can replicate journal chunks comprising system, user, etc., metadata. Journal chunks can be replicated to some, none, or all zones within a geographically diverse data storage system. Storage services at each replication destination, e.g., zone, can keep copies of some, none, or all DTs of other remote zones. Storage services of a first zone can replay journals of other zones to update the first zone view of trees, e.g., DTs, from other zones.

Conventionally, scaling-in of a geographically diverse data storage system, can be accomplished by 'turning off' a zone to be removed, e.g., the zone can enter a permanent site outage (PSO) state. A PSO event can cause recovery of a zone state, which can be complex because of the asynchronous character of chunk replication in ECS. At a tree/partition level, the existing implementation of going into a PSO state for a zone can include: each zone replaying a journal received from a PSO zone; zones each stop replaying the journal in response to another journal entry or a repository chunk referenced from another journal entry being determined to be missing; remaining zones comparing resulting trees generated from the replaying the journal; determining which zone has a most complete, e.g., up-to-date, tree, which zone then can become the owner of the tree; and bootstrapping the most complete tree, e.g., from the tree owner, to other remaining zones. In the conventional technique, zone recovery can also involve recovery and re-protection of repository chunks, however, handling of repository chunks can be distinct and is considered generally outside the scope of the present disclosure and is not further discussed in detail to avoid confusion. The general issue is that customers, for example ECS customers, etc., who need to scale-in just "switch off" a zone by declaring that the zone is in PSO to cause the above noted conventional zone recovery. This can lead to data being less accessible or inaccessible until a recovery is completed, the recovery perhaps being less than complete, recovery consuming large amounts of computing resources to perform the recovery, recovery needing to occur immediately and quickly to restore data access, etc. Such a primitive approach for scaling-in can be regarded as wasteful and not a best practice, especially where it can also temporary, or even permanently, impact data availability.

In regard to user-generated data stored via repository chunks, and to provide context to a geographically diverse data storage system, a first data chunk and a second data chunk corresponding to a first and second zone that are geographically diverse can be stored in a third data chunk stored at third zone that is geographically diverse from the first and second zones. In an aspect the third chunk can represent the data of the first and second data chunks in a compressed form, e.g., the data of the first data chunk and the second data chunk can be convolved, such as by an XOR function, into the third data chunk. In an aspect, first data of the first data chunk and second data of the second data chunk can be convolved with or without replicating the entire first data chunk and the entire second data chunk at data store(s) of the third zone, e.g., as at least a portion of the first data chunk and at least a portion of the second data chunk are received at the third zone, they can be convolved to form at least a portion of the third data chunk. In an aspect, where compression occurs without replicating a chunk at another zone prior to compression, this can be termed as 'on-arrival data compression' and can reduce the count of replicate data made at the third zone and data transfers events can correspondingly also be reduced. In an aspect, convolution can also be based on copies of the first and second chunks created at the third zone. In an aspect, a convolved chunk stored at a geographically diverse storage device can comprise data from some or all storage devices of a geographically diverse storage system. As an example, where there are five storage devices, a first storage device can convolve chunks from the other four storage devices to create a 'backup' of the data from the other four storage devices. In this example, the first storage device can create a backup chunk from chunks received from the other four storage devices. In an embodiment, this can result in generating copies of the four received chunks at the first storage device and then convolving the four chunks to generate a fifth chunk that is a backup of the other four chunks. Moreover, one or more other copies of the four chunks can be created at the first storage device for further redundancy. In another example, the first storage device can convolve chunks from three of the other four storage devices.

In an aspect, a ZSC can comprise one or more data storage components that can be communicatively coupled, e.g., a ZSC can comprise one data store, two or more communicatively coupled data stores, etc. In an aspect, this can allow replication of data in the ZSC and can provide data redundancy in the ZSC, for example, providing protection against loss of one or more data stores of a ZSC. As an example, a ZSC can comprise multiple hard drives and a chunk can be stored on more than one hard drive such that, if a hard drive fails, other hard drives of the ZSC can comprise the chunk, or a replicate of the chunk. As such, there can be redundancy in a zone and other redundancy between zones.

In an aspect, as data in chunks becomes stale, old, redundant, etc., it can be desirable to delete these chunks to free storage space for other uses. In an aspect, a convolved chunk can be de-convolved, partially or completely, to yield other chunks, e.g., the other chunks can represent the same data as the convolved chunk but can typically consume more storage space because these other chunks are less highly convolved. As an example, the chunk (AB(CD)), which can be chunk A convolved with Chunk B convolved with a chunks that itself is a convolution of chunks C and D, can be deconvolved into chunks A to D, into chunks A, B, and (CD), into chunks A and B(CD), etc. Moreover, in this example, because the convolution can be commutative, such as where an XOR function is used to convolve/deconvolve the data, the chunk (AB(CD)) can be deconvolved into, for example, chunks B and A(CD), chunks A, D, and (BC), etc. Where a chunk is to be deleted in a remote zone, the deconvolution can comprise transfer of other chunks to facilitate the deconvolution. As an example, where the chunk (AB(CD)) is at a first zone, and chunk D is to be deleted, data for chunks A, B, and C, can be replicated in the first zone from other zones to allow deconvolution, e.g., (AB(CD) XOR (ABC), where data for chunks A, B, and C, is replicated into the first zone can result in chunks (ABC) and D, such that chunk D can be deleted and leave just chunk (ABC) at the first zone. As such, it can be desirable to reduce the resource consumption in replicating chunks between zones to facilitate the deletion of a chunk from a convolved chunk. As an example, it can consume less bandwidth to replicate chunk (ABC) from a second zone to the example first zone as compared to replicating each of chunk A, chunk B, and chunk C from the second zone to the first zone. This can be accommodated, for example, by first, in the second zone, generating a compressed chunk (ABC), such as from chunks A, B, and C, from chunk AB and chunk C, from chunk AC and chunk B, etc., prior to replicating generated chunk ABC into the first zone.

Similarly, recovery of data from a convolved chunk can be computer resource intensive, e.g., processor, memory, network, storage, etc., intensive. As an example, loss of access to data of a Seattle zone can result in deconvolution of convolved chunks in other zones as part of recovering the Seattle zone. The example deconvolution can comprise moving chunks between the other zones to enable the deconvolution at the other zones, use of processor time in the other zone, use of memory in the other zones, use of storage space in the other zones, etc. As such, it can be desirable to spread the burden of a recovery process over many zones, e.g., it can be desirable that many processors, memories, storage devices, networks, etc., are active in the recovery in comparison to burdening fewer zones more heavily to achieve the same recovery. As an example, where a failed Seattle zone data is redundantly stored in convolved chunks in three other zones, these three zones and their associated computer resources can perform the data recovery in a first time and with a first cost, wherein cost can be monetary cost, resource usage, etc. Where, in this example, the Seattle zone was backed up across eight zones, for example, comprising the previous three zones, the disaster recovery can occur in a second time at a second cost. Whereas the count of processors, memory, storage area, and available network resources is larger in the eight zone permutation, the second time and second cost can be expected to be lower than the first time and the first cost.

In an aspect, compression/convolution of chunks can be performed by different compression/convolution technologies. Logical operations can be applied to chunk data to allow compressed data to be recoverable, e.g., by reversing the logical operations to revert to an earlier form of chunk data. As an example, data from chunk 1 can undergo an exclusive-or operation, hereinafter 'XOR', with data from chunk 2 to form chunk 3. This example can be reversed by XORing chunk 3 with chunk 2 to generate chunk 1, etc. While other logical and/or mathematical operations can be employed in compression of chunks, those operations are generally beyond the scope of the presently disclosed subject matter and, for clarity and brevity, only the XOR operator will be illustrated herein. However, it is noted that the disclosure is not so limited and that those other operations or combinations of operations can be substituted without departing from the scope of the present disclosure. As such, all logical and/or mathematical operations for compression germane to the disclosed subject matter are to be considered within the scope of the present disclosure even where not explicitly recited for the sake of clarity and brevity.

In an aspect, the presently disclosed subject matter can include 'zones'. A zone can correspond to a geographic location or region. As such, different zones can be associated with different geographic locations or regions. As an example, Zone A can comprise Seattle, Wash., Zone B can comprise Dallas, Tex., and, Zone C can comprise Boston, Mass. In this example, where a local chunk from Zone A is replicated, e.g., compressed or uncompressed, in Zone C, an earthquake in Seattle can be less likely to damage the replicated data in Boston. Moreover, a local chunk from Dallas can be convolved with the local Seattle chunk, which can result in a compressed/convolved chunk, e.g., a partial or complete chunk, which can be stored in Boston. As such, either the local chunk from Seattle or Dallas can be used to de-convolve the partial/complete chunk stored in Boston to recover the full set of both the Seattle and Dallas local data chunks. The convolved Boston chunk can consume less disk space than the sum of the Seattle and Dallas local chunks. An example technique can be "exclusive or" convolution, hereinafter 'XOR', '⊕', etc., where the data in the Seattle and Dallas local chunks can be convolved by XOR processes to form the Boston chunk, e.g., C=A1⊕B1, where A1 is a replica of the Seattle local chunk, B1 is a replica of the Dallas local chunk, and C is the convolution of A1 and B1. Of further note, the disclosed subject matter can further be employed in more or fewer zones, in zones that are the same or different than other zones, in zones that are more or less geographically diverse, etc. As an example, the disclosed subject matter, in some embodiments, can be applied to data of a single disk, memory, drive, data storage device, etc., without departing from the scope of the disclosure, e.g., the zones in some embodiments can represent different logical areas of the single disk, memory, drive, data storage device, etc. Moreover, it will be noted that convolved chunks can be further convolved with other data, e.g., D=C1⊕E1, etc., where E1 is a replica of, for example, a Miami local chunk, E, C1 is a replica of the Boston partial chunk, C, from the previous example and D is an XOR of C1 and E1 located, for example, in Fargo.

In an aspect, XORs of data chunks in disparate geographic locations can provide for deconvolution of the XOR data chunk to regenerate the input data chunk data. Continuing a previous example, the Fargo chunk, D, can be de-convolved into C1 and E1 based on either C1 or D1; the Miami chunk, C, can be de-convolved into A1 or B1 based on either A1 or B1; etc. Where convolving data into C or D comprises deletion of the replicas that were convolved, e.g., A1 and B1, or C1 and E1, respectively, to avoid storing both the input replicas and the convolved chunk, deconvolution can rely on retransmitting a replica chunk that so that it can be employed in de-convoluting the convolved chunk. As an example the Seattle chunk and Dallas chunk can be replicated in the Boston zone, e.g., as A1 and B1. The replicas, A1 and B1 can then be convolved into C. Replicas A1 and B1 can then be deleted because their information is redundantly embodied in C, albeit convolved, e.g., via an XOR process, etc. This leaves only chunk C at Boston as the backup to Seattle and Dallas. If either Seattle or Dallas is to be recovered, the corollary input data chunk can be used to deconvolve C. As an example, where the Seattle chunk, A, is corrupted, the data can be recovered from C by deconvolving C with a replica of the Dallas chunk B. As such, B can be replicated by copying B from Dallas to Boston as B1, then de-convolving C with B1 to recover A1, which can then be copied back to Seattle to replace corrupted chunk A.

In some circumstances, disk space management can seek to recover underutilized disk space. As an example, where the Seattle chunk, A, is to be deleted, recovery of the Dallas chunk, B, via Boston convolved chunk, C, becomes dependent on having a copy of B to deconvolve C with after A has been deleted. As such, it can be desirable to deconvolve C into A1 and B1 prior to deleting A and A1, such that B1 can be convolved with another chunk, for example Miami chunk, E. As such, recovery of B1 can be based on E1 and the XOR of B1E1. Also of note, to deconvolve C in to A1 and B1, a replica of A, e.g., A1 is made in Boston, this allows recovery of B1. Once B1 is recovered, C, A1, and A can be deleted. Then B1 can be convolved with E1. It will be noted that data is transferred, e.g., A is copied into A1 from Seattle to Boston, to allow C to be de-convolved.

In some embodiments, the disclosed subject matter can protect metadata stored in DTs via tree chunks. Tree chunks can be updated as the metadata changes, which updates can be reflected in journals stored in journal chunks in an interim period between writing tree chunks. As an example, a tree chunk can comprise data representing metadata up to 5 pm on a Tuesday. Changes to the example metadata can occur over the next 24 hours, e.g., from 5 pm Tuesday until 5 pm Wednesday. These changes can be stored as journal data, e.g., via journal chunks in non-volatile memory, etc., and can be embodied in an effective tree state stored in volatile memory. Should a failure occur in the system that results in the volatile memory being lost, the Tuesday tree and the journal can be employed to recover the effective state. In this example, at 5 pm Wednesday, the Tuesday tree chunk can be updated to a Wednesday tree chunk based on the effective state, the Tuesday tree and the journal, etc. The Wednesday tree chunk can therefore represent the most up-to-date tree data. In an embodiment, one or more of the Tuesday tree chunk, the journal chunk, etc., can be deleted, released, etc., to reduce memory/storage use. However, in some embodiments, one or more 'interim' tree chunks, journal chunks, etc., can be preserved to provide additional redundancy, for example, trees/journals for the last three days can be retained and trees/journals older than three days can be released/deleted.

In an embodiment of the disclosed subject matter, rather than making a zone to be removed PSO, the zone can be placed in a read-only (RO) state. From the RO state, the tree/journal, e.g., in corresponding chunk-types, can be replicated to other zones while the RO zone remains readable. This can address lack of data access associated with the conventional PSO technique. Moreover, this can allow for replication of tree/journal data with less time sensitivity, in a more comprehensive manner, and typically with lower computer resource demands, because the tree/journal of the RO zone can be read from the RO zone to other zones for replication, rather than the other zones relying on rebuilding a tree based on a last received tree/journal before the zone to be removed was put into a non-readable PSO state. As an example, where zone A is to be removed and is marked RO, then zone B and C can receive a tree and journal read from zone A. In contrast, where zone A suddenly goes PSO, zones B and C would need to recover the tree of zone A based on a previously received tree/journal from zone A that may not be up-to-date, which can result in data loss. Moreover, where example zone A is in RO, data on zone A can still be read while the replication of the tree/journal to zones B and C occurs, again in contrast to PSO'ing zone A which causes zone A data to be less accessible until zones B and C recover for PSO'ed zone A. Additionally, where zone A data is less accessible, there can be a high priority to recover zone A data in zones B and C, forcing a greater expenditure of computing resources in contrast to the data of zone A being accessible where zone A is RO.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages, and novel features of the disclosed subject matter will become apparent from the following detailed description when considered in conjunction with the provided drawings.

FIG. 1 is an illustration of a system 100, which can facilitate preserving data during scaling of a geographically diverse storage system, in accordance with aspects of the subject disclosure. System 100 can comprise zone storage components (ZSCs), e.g., first ZSC 110, second ZSC 120, N-th ZSC 130, etc. The ZSCs can communicate with the other ZSCs of system 100, e.g., via communication framework (CF) 102, etc. A zone can correspond to a geographic location or region. As such, different zones can be associated with different geographic locations or regions. A ZSC can comprise one or more data stores in one or more locations. In an aspect, a ZSC can store at least part of a data chunk, e.g., chunks 140, 150, . . . , 160, etc., on at least part of one data storage device, e.g., hard drive, flash memory, optical disk, server storage, etc., for example, storage device 114, . . . , 116, etc., which can regarded as a storage pool, e.g., storage pool 112, 122, 132, etc. Moreover, a ZSC can store at least part of one or more data chunks on one or more data storage devices, e.g., on one or more hard disks, across one or more hard disks, etc., and data chunks can store data, e.g., data 142, . . . , 144, etc., of one or more data-types, e.g., user-generated data types, metadata types, directory table types, tree types, journal types, etc. As an example, a ZSC can comprise one or more data storage devices in one or more data storage centers corresponding to a zone, such as a first hard drive in a first location proximate to Miami, a second hard drive also proximate to Miami, a third hard drive proximate to Orlando, etc., where the related portions of the first, second, and third hard drives correspond to, for example, a 'Florida zone', 'Southeastern United States zone', etc.

In an aspect, data chunks, e.g., chunk 112, 122, etc., can be replicated in their source zone, in a geographically diverse zone, in their source zone and one or more geographically diverse zones, etc. As an example, a Seattle zone can comprise a first chunk that can be replicated in the Seattle zone to provide data redundancy in the Seattle zone, e.g., the first chunk can have one or more replicated chunks in the Seattle zone, such as on different storage devices corresponding to the Seattle zone, thereby providing intra-zone data redundancy that can protect the data of the first chunk, for example, where a storage device storing the first chunk or a replicate thereof becomes compromised, the other replicates (or the first chunk itself) can remain uncompromised within the zone. In an aspect, data replication in a zone can be on one or more storage devices, e.g., a chunk can be stored on a first data storage device, a second chunk can be stored on a second storage device, and a third chunk can be stored on a third storage device, wherein the first, second, and third storage devices correspond to the first zone, and wherein the first, second, and third storage devices can be the same storage device or different storage devices. Replication of chunks, e.g., the first chunk, into other chunks can comprise communicating data, e.g., over a network, bus, etc., to other data storage locations on the first, second, and third storage devices and, moreover, can consume data storage resources, e.g., drive space, etc., upon replication. As such, the number of replicates can be based on balancing resource costs, e.g., network traffic, processing time, cost of storage space, etc., against a level of data redundancy, e.g., how much redundancy is needed to provide a level of confidence that the data/replicated data will be available within a zone.

In an aspect, replication of a chunk(s), e.g., replicated chunk 141, etc., can enable deconvolution of a convolved chunk(s) at another zone(s). As an example, where chunk 112 and chunk 122 are convolved into chunk 132, then chunk 112 can be recovered via deconvolving chunk 132 with chunk 122 or a copy of chunk 122, chunk 122 can be recovered via deconvolving chunk 132 with chunk 112 or a copy of chunk 112, etc. In an aspect, chunk 112, chunk 122, etc., can be copied into N-th ZSC 130 to facilitate deconvolution of chunk 132, for example, in a data recovery event, in a data deletion event, etc. Copying can consume computer resources, e.g., can occur over a network, can entail a processor to transmit a chunk copy via the network interface, a memory at N-th ZSC 130 to store the copy, a processor of N-th ZSC 130 to deconvolve chunk 132 with the copy, storage space of N-th ZSC 130 to store the deconvolved chunks, network resources to send the recovered copy as part of the rebuilding process, etc.

ZSCs, e.g., ZSC 110, 120, 130, etc., can comprise a scaling component, e.g., scaling component 118, 128, 138, etc., that can facilitate control of zones related to adding, removing, etc., a zone from a geographically diverse data storage system, e.g., system 100. In an aspect, a scaling component, for a scaling-in event, can facilitate setting a zone to be removed as read-only (RO), can facilitate replicating chunks between an RO zone and other zones, can facilitate deletion/removal of a zone in response to completion of data preservation operations, etc. In another aspect, a scaling component, for a scaling-out event, can facilitate replicating chunks between a new zone and other zones, etc. Scaling components, e.g., 118-138, etc., can communicate with other scaling components via CF 102 to coordinate, orchestrate, etc., a scaling operation. As an example, scaling component 118 can receive an indication that ZSC 110 is to be removed. In response, scaling component 118 can communicate to scaling component 128 and scaling component 138 that ZSC 110 will enter an RO state and that ZSC 120 and ZSC 130 should prepare to receive data, e.g., tree data, journal data, etc. It is noted that the data can be comprised in tree chunks, journal chunks, etc., or can be comprised as tree objects, journal objects, etc., read from ZSC 110 and communicated to ZSC 120, 130, etc., for incorporation into corresponding chunk types at ZSC 120, 130, etc. Returning to the example, scaling component 118 can then facilitate setting ZSC in to a RO state, whereupon, ZSC 110 can stop receiving new data, can complete queued data storage/replications receiving prior to going RO, can update tree data for ZSC 110, etc., e.g., ZSC 110 can safely complete event operations and clean up prior to being removed from system 100. Moreover, ZSC 110 can remain readable, even though in RO mode it no longer accepts new data. Scaling component 118 can then facilitate communication of data for replication to other ZSCs, e.g., 120, 130, etc., of system 100, for example, communicating an up-to-date tree from RO'ed ZSC 110 to the other ZSCs. This can allow for a complete and up-to-date DT for ZSC 110 to be replicated, e.g., via replicated chunk 141, etc., at other ZSCs of system 100, in contrast to ZSC 110 just be in shut off under conventional techniques that can cause ZSCs 120 and 130 to rely on recovering a 'ZSC 100 tree' from perhaps out of date tree/journal data received prior to ZSC 110 being shut off.

Figure 2:
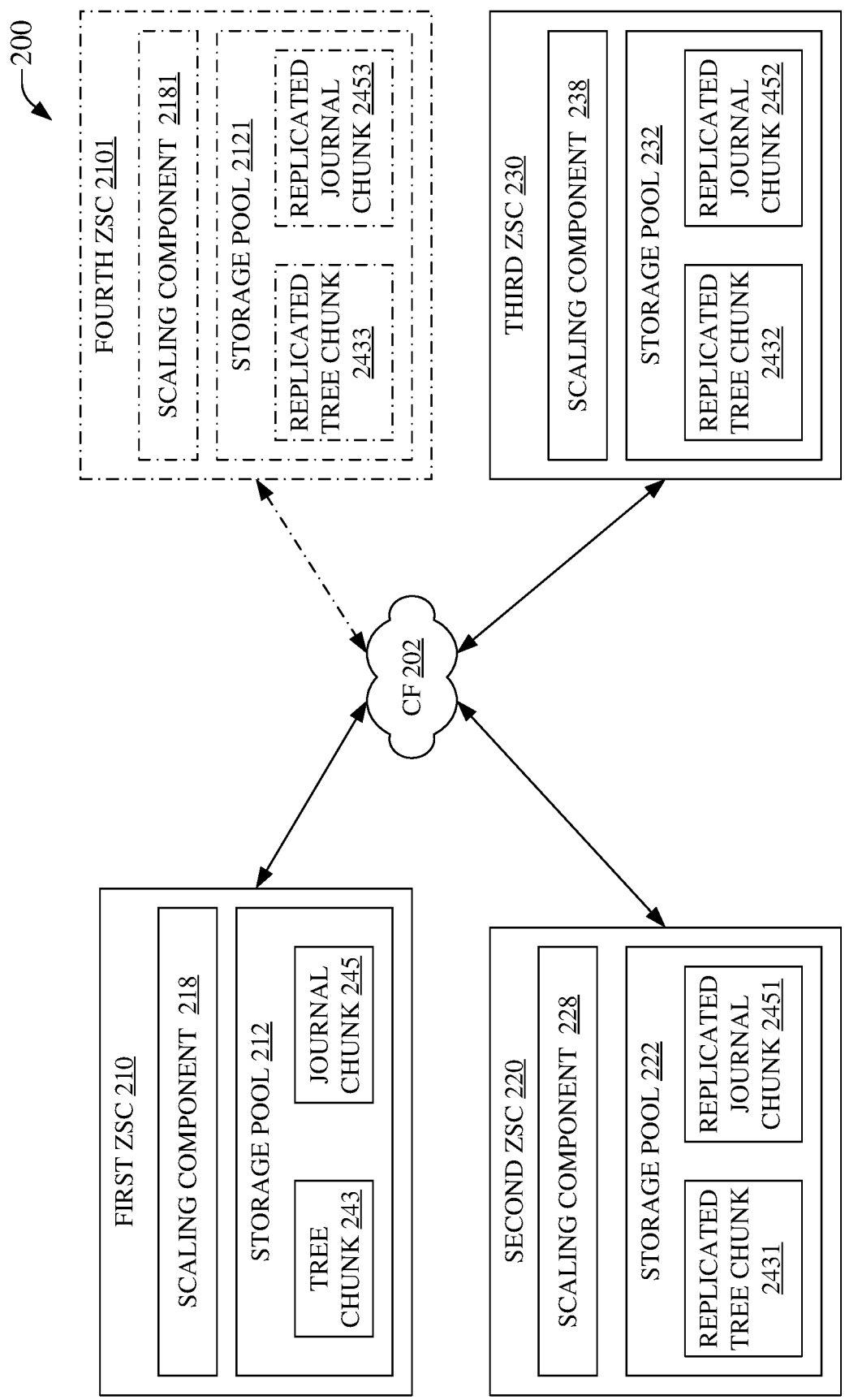
FIG. 2 is an illustration of an example system that can facilitate preserving data during scaling-out of a geographically diverse storage system, in accordance with aspects of the subject disclosure.

FIG. 2 is an illustration of a system 200, which can enable preserving data during scaling-out of a geographically diverse storage system, in accordance with aspects of the subject disclosure. System 200 can comprise ZSCs 210, 220, 230, etc., that can comprise scaling component(s), e.g., 218-238, etc., storage pool(s), e.g., 212-232, etc., wherein the storage pools can comprise data, typically stored in chunk form. Chunks can comprise tree chunks, e.g., 243, etc., journal chunks, e.g., 245, etc., replicated tree chunks, e.g., 2431, 2432, etc., replicated journal chunks, e.g., 2451, 2452, etc., or other chunks. Data, chunks, etc., can be communicated between ZSCs, and events can be conducted between ZSCs, via CF 202.

System 200 can be scaled-out, e.g., a new zone can be added to the geographically diverse data storage system. This can be represented by adding fourth ZSC 2101 to system 200. Fourth ZSC 2101 can similarly comprise a scaling component, e.g., 2181, a storage pool, e.g., 2121, etc. Moreover, upon addition of fourth ZSC 2101 to system 200, one or more of scaling components 218, 228, 238, etc., can facilitate replicating data/chunks into the newly added zone. As an example, replicated tree chunk 2433 and replicated journal chunk 2453 can be communicated to fourth ZSC 2101 by one or more of scaling components 218-238, etc. In this example, replicated tree chunks 2431, 2432, 2433, etc., can be replicates of tree chunk 243 and can provide redundancy of the tree data in different geographical locations. Similarly in this example, replicated journal chunks 2451, 2452, 2453, etc., can be replicates of journal chunk 245 and can provide redundancy of the journal data in different geographical locations.

In an aspect, tree chunks, journal chunks, etc., of other ZSCs can be replicated among the ZSCs of system 200. As an example, a tree chunk of ZSC 220 can be replicated at ZSCs 210, 230, 240, etc. Although this is not illustrated for the sake of clarity and brevity, replication of chunks to other zones of a geographically diverse data storage system is specifically regarded as within the scope of the instant disclosure even where note explicitly recited or illustrated for clarity and brevity, e.g., system 200 can illustrate replication of tree chunk 243 and journal chunk 245 to other zones, including later added zones, but system 200 also facilitates replication of chunks from ZSC 220 to other zones, from ZSC 230 to other zones, from ZSC 2101 to other zones, etc., even where not illustrated to avoid inducing confusion and significantly more complicated figures.

Figure 3:
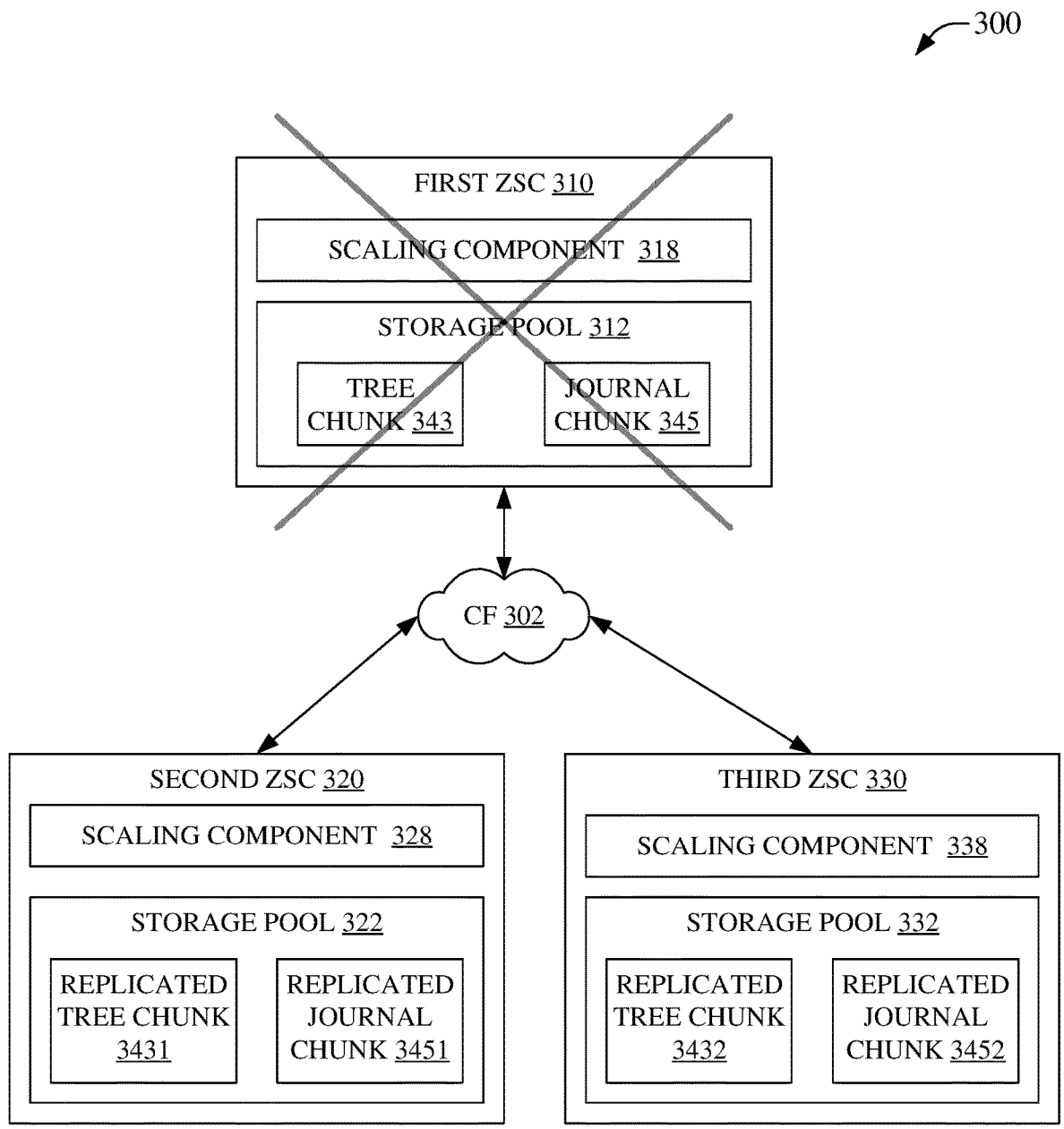
FIG. 3 is an illustration of an example system that can enable preserving data during scaling-in of a geographically diverse storage system, in accordance with aspects of the subject disclosure.

FIG. 3 is an illustration of a system 300, which can facilitate preserving data during scaling-in of a geographically diverse storage system, in accordance with aspects of the subject disclosure. System 300 can comprise ZSCs 310, 320, 330, etc., that can comprise scaling component(s), e.g., 318-338, etc., storage pool(s), e.g., 312-332, etc., wherein the storage pools can comprise data, typically stored in chunk form. Chunks can comprise tree chunks, e.g., 343, etc., journal chunks, e.g., 345, etc., replicated tree chunks, e.g., 3431, 3432, etc., replicated journal chunks, e.g., 3451, 3452, etc., or other chunks. Data, chunks, etc., can be communicated between ZSCs, and events can be conducted between ZSCs, via CF 302.

System 300 can be scaled-in, e.g., an existing zone can be removed from the geographically diverse data storage system. This can be represented by removing first ZSC 310 to system 300. Upon receiving an indication that first ZSC 310 is to be removed from system 300, scaling component 318 can enable marking first ZSC 310 as read only (RO). In RO mode, first ZSC 310 can stop receiving new data for storage, replication, etc., while also remaining visible in the geographically diverse data storage system to enable access to data stored on first ZSC 310. First ZSC 310 can then, in some embodiments, complete pending operations, e.g., writing data already in queue, convolving data already in queue, etc. First ZSC 310 can then update tree chunk 343 based on journal chunk 345. In some embodiments, where an effective state is resident in volatile memory, tree data of tree chunk 343 can be updated based on the effective state, which can cause journal data in journal chunk 345 to be redundant, whereupon journal chunk 345 can simply be deleted.

In an embodiment, replicated tree chunk 3431 and tree chunk 3432 can be a replicates of tree chunk 343 prior to tree chunk being updated as part of the RO event. Similarly, replicated journal chunk 3451 and replicated journal chunk 3452 can be replicates of some form of journal chunk 345, e.g., as journal chunk 345 is updated based on changes to metadata of first ZSC 310, replicates can be made at other zones, wherein these replicates can be copies at the same or different times, e.g., replicated journal chunks 3451 and 3452 can be replicates of journal chunk 345 at the same or different times and therefore the replicated journal chunks can be up-to-date, out-of-date to the same degree, out-of-date to different degrees, etc. In conventional techniques, e.g., where first ZSC 310 is simply shut off, the replicated tree and replicated journal chunks could be used to rebuild a correspondingly up-to-date tree chunk for lost first ZSC 310, however, these rebuilt tree chunks can be up-to-date or can be out-of-date to the same or different levels. However, where first ZSC 310 is put in RO mode via scaling component 318, and where tree chunk 343 is updated based on journal chunk 345 and/or an effective state of first ZSC 310, then scaling component 318 can interact with scaling components 328, 338, etc., to update replicated tree chunk 3431, 3432, etc., as up-to-date rather than possibly being out-ofdate as previously disclosed. In an embodiment, where replicated tree chunk 3431 and 3432 are up-to-date based on an update tree chunk 343, then replicated journal chunk 3451, and 3452 can be deleted as being irrelevant in view of the replicated tree chunks being known to be up-to-date. At this point, the data of first ZSC 310, can be represented in data stored in other ZSCs and first ZSC 310 can be removed, deleted, etc. It is noted that the full tree data of first ZSC 310 is now replicated in each of the other ZSCs of system 300, which can be an inefficient use of storage space, but does provide excellent data redundancy. Accordingly, it can be desirable to improve data storage space efficiency, as is further discussed herein.

Figure 4:
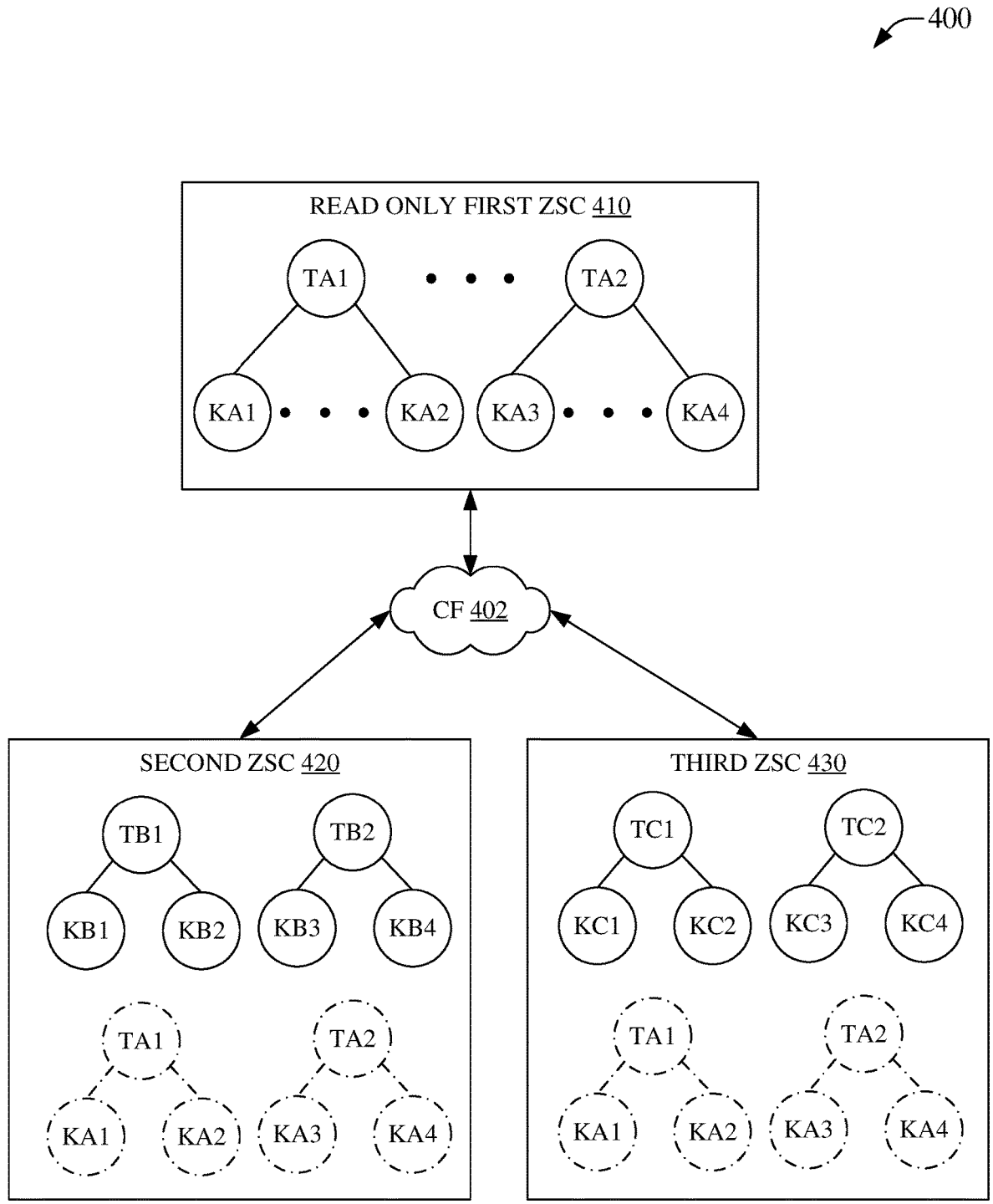
FIG. 4 is an illustration of an example system that can enable preserving, via replication of data on other zones, data during scaling-in of a geographically diverse storage system, in accordance with aspects of the subject disclosure.

FIG. 4 is an illustration of a system 400 that can enable preserving, via replication of data on other zones, data during scaling-in of a geographically diverse storage system, in accordance with aspects of the subject disclosure. System 400 can comprise ZSCs 410, 420, 430, etc., that can comprise scaling component(s), storage pool(s), etc., wherein the storage pools can comprise data, typically stored in chunk form. Chunks can comprise tree chunks, journal chunks, replicated tree chunks, replicated journal chunks, or other chunks. Data, chunks, etc., can be communicated between ZSCs, and events can be conducted between ZSCs, via CF 402.

System 400 can be scaled-in, e.g., an existing zone can be removed from the geographically diverse data storage system. This can be represented by making a first ZSC read-only, e.g., removing read only first ZSC 410 from system 400. Upon receiving an indication that first ZSC 410 is to be removed from system 400, a scaling component can mark a first ZSC as RO. In RO mode, read only first ZSC 410 can stop receiving new data for storage, replication, etc., while also remaining visible in the geographically diverse data storage system to enable access to data stored on read only first ZSC 410. Read only first ZSC 410 can then, in some embodiments, complete pending operations, e.g., writing data already in queue, convolving data already in queue, etc. Read only first ZSC 410 can then update a tree chunk based on a journal chunk. In some embodiments, where an effective state is resident in a volatile memory of read only first ZSC 410, tree data of a tree chunk can be updated based on the effective state, which can cause journal data in a journal chunk to be irrelevant, whereupon the journal chunk can be deleted.

In an embodiment, the tree data of a tree chunk can be hashed to generate portions of tree data and corresponding key data. Key data can be data of a DT accessed by a given key. In an embodiment, the key data associated with a portion of the tree data can enable access to DT data corresponding to a key relevant to the portion of the tree data. FIG. 4 illustrates tree data (comprised in a not illustrated tree chunk) as "Txx", e.g., TA1 is a first portion of tree data for read only first ZSC 410, TB2 is a second portion of tree data for second ZSC 420, TC1 is a first portion of tree data for third ZSC 430, etc. Similarly, FIG. 4 illustrates key data as "Kxx", e.g., KA1 is a first key data of a TA1, KA2 is a second key data of TA1, KB1 is a first key data of TB1, KB4 is a fourth key data of TB2, etc.

Tree data and key data can be replicated from read only first ZSC 410, e.g., after updating as discussed, for example, in system 300, to other ZSCs, for example, TA1 through TA2, and corresponding key data KA1 through KA4, etc., can be replicated from read only first ZSC 410 to second ZSC 420 and to third ZSC 430, as illustrated. This can embody complete replication of tree data and key data from read only first ZSC 410 into other zones, providing excellent redundancy. At this point read only first ZSC 410 can be removed, deleted, etc. However, as discussed for system 300, this replication technique, while gracefully allowing removal of a ZSC, can be overly redundant and waste some storage space. As an example, in a long-living data storage system, there can be multiple scale out/in events that can result in a large number of trees replicated into all other zones which can significantly increase resource consumption of the storage system. As such, it can similarly be desirable to use storage space more efficiently.

Figure 5:
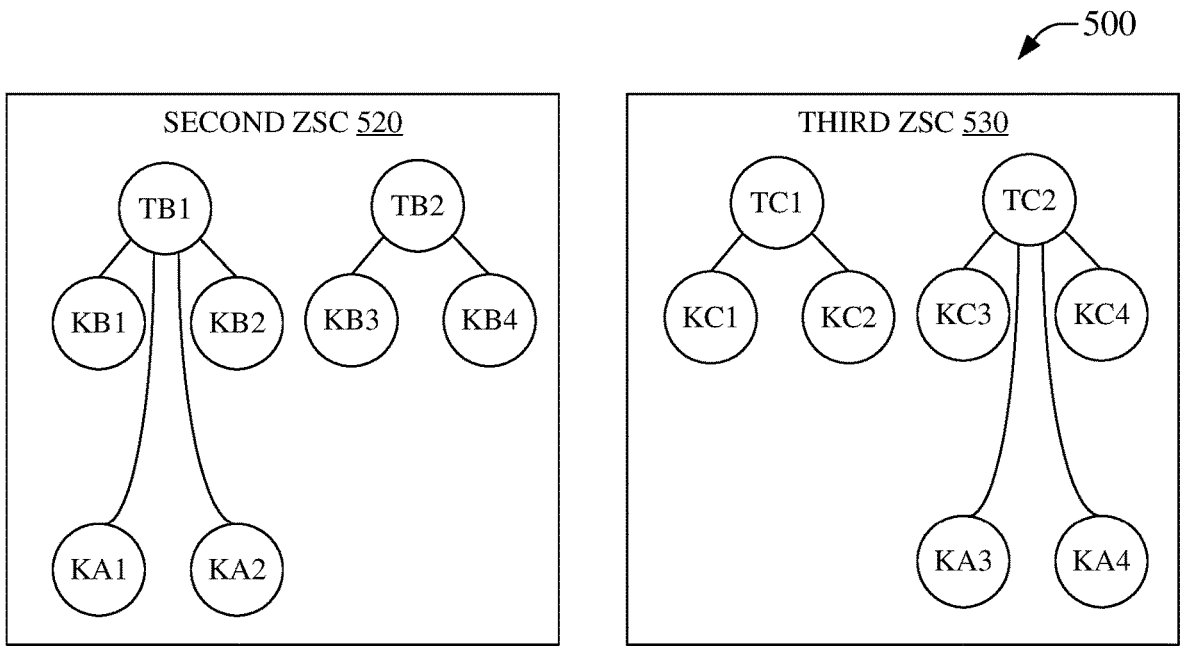
FIG. 5 is an illustration of example systems that can each enable preserving, via replication and merging of data in other zones, data during scaling-in of a geographically diverse storage system, in accordance with aspects of the subject disclosure.
Figure 5:
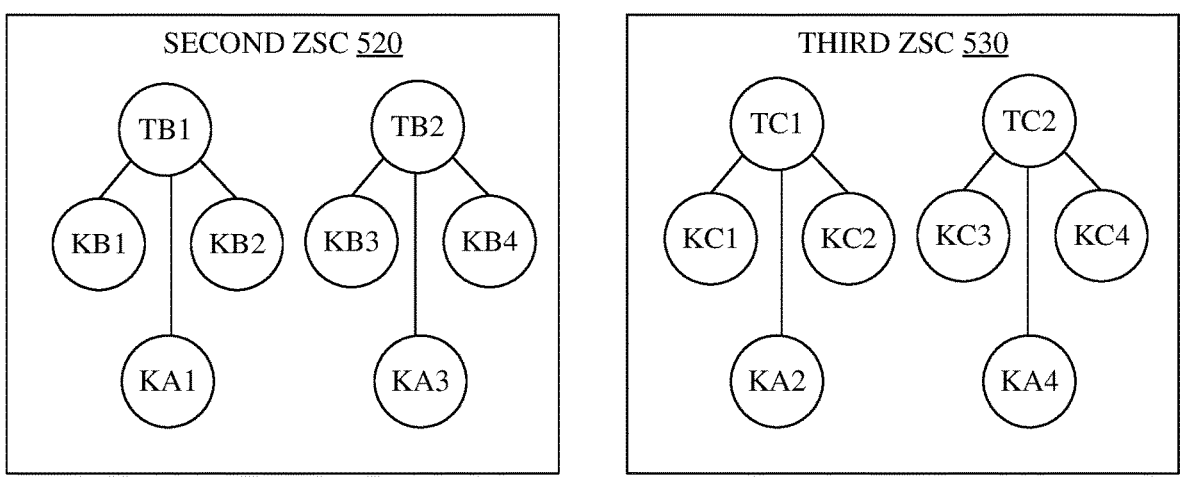

FIG. 5 is an illustration of example systems 500 and 501 that can each enable preserving, via replication and merging of data in other zones, data during scaling-in of a geographically diverse storage system, in accordance with aspects of the subject disclosure. System 500 illustrates merging of data replicated into a zone during a scaling-in event. System 500 can illustrate remaining ZSCs 520 and 530 after removal of a first ZSC, e.g., after removal of read only first ZSC 410 in system 400, etc. Replicated data can initially be simply copied into second and third ZSCs 520 and 530 in a manner similar to that illustrated for second and third ZSCs 420 and 430 of system 400. As has been noted, this replication can be overly redundant and can consume more storage space than is necessary. As such, where chunks can comprise data from different sources, there is no prohibition against merging the replicated TA1 through TA2 into the tree data stored in tree chunks of second ZSC 520, third ZSC 530, etc. in an intelligent manner. A straightforward solution can be to divide legacy partitions, e.g., portions of tree data from a deleted zone, among the remaining zones and let each zone absorb, merge, etc., the content of the legacy partitions it received. A hashing function can be used to distribute portions of the tree data, e.g., legacy partitions, among the remaining zones for merging with portions of zone-local trees of those remaining zones, this can be termed 'horizontal' hashing. However, this can result in a considerable imbalance within the resulting DTs of the remaining zones. As an example, system 500 illustrates a result of merging TA1 into TB1 of second ZSC 520, and attaching the corresponding key data to TB1, e.g., KA1 through KA2 are now correlated to TB1 based on the merged tree data TA1. Similarly TA2 can be merged with TC2 of third ZSC 530 and key data KA3 through KA4 can be correlated to TC2 based on the merging of the TA2 data into TC2. As a result, the first partition of second ZSC 520, e.g., TB1, can contain twice the keys of a second partition of the zone, e.g., TB2 and, similarly, the TC2 can comprise twice the keys of TC1 in third ZSC 530.

In an aspect, this can result in more efficient use of storage space in comparison to keeping full copies of the tree/key data from a removed zone in each other zone. However, in another aspect, this can result in an imbalance of key data, e.g., TB1, after the merge, comprises at least four keys, e.g., KB1 though KB2 and KA1 through KA2, while TB2 comprises fewer keys, e.g., KB3 through KB4. Similar effects are noted in third ZSC 530. As such, it can be desirable to merge replicated tree data in a manner that results in more evenly distributed keys.

Turning to system 501, which also illustrates merging of data replicated into a zone during a scaling-in event, remaining ZSCs 520 and 530 can remain after removal of a first ZSC, e.g., after removal of read only first ZSC 410 in system 400, etc. Replicated data can initially be simply copied into second and third ZSCs 520 and 530 of system 501 in a manner similar to that illustrated for second and third ZSCs 420 and 430 of system 400. Again, as has been noted, this replication can be overly redundant and can consume more storage space than is necessary. As such, merging the replicated TA1 through TA2 into the tree data stored in tree chunks of second ZSC 520, third ZSC 530, etc. in an intelligent manner can reduce storage space usage while still providing adequate redundancy of DT data stored in tree chunks.

Unlike system 500, system 501 can perform a second hashing of replicated data to distribute key data among tree data portions resulting from a first hashing of the replicated data, e.g., where the first hashing function can be regarded as distributing tree data portions by splitting tree data of a deleted zone into different portions that can be combined with other tree portions of other zones, e.g., horizontal hashing such as in system 500, the second hashing function can distribute the key data among the tree data portions in a manner that results in more even distribution of key data, which can be termed 'vertical' hashing. As such, horizontal and vertical hashing of the replicated tree data from a deleted zone can result in merging, according to the horizontal hashing, TA1 into TB1 of second ZSC 520, and attaching, according to the vertical hashing, the some of the corresponding key data to TB1, e.g., KA1 can be adopted by TB1. Similarly, horizontal and vertical hashing can merge TA2 into TB2 of second ZSC 520, KA3 can be adopted by TB2. This can be similarly performed in third ZSC 530 resulting in KA2 being adopted by TC1 that comprises TA1 tree data, and KA4 being adopted by TC2 that comprises TA2 tree data. As can be observed, the use of both a horizontal hashing function and a vertical hashing function can preserve the tree data of a deleted zone after a scaling-in event, and can also result in more even distribution of key data that is observed for system 500 that can rely on only horizontal hashing.

In an aspect, this can result in more efficient use of storage space in comparison to keeping full copies of the tree/key data from a removed zone in each other zone. However, in another aspect, this can result in an imbalance of key data, e.g., TB1, after the merge, comprises at least four keys, e.g., KB1 though KB2 and KA1 through KA2, while TB2 comprises fewer keys, e.g., KB3 through KB4. Similar effects are noted in third ZSC 530. As such, it can be desirable to merge replicated tree data in a manner that results in more evenly distributed keys.

Figure 6:
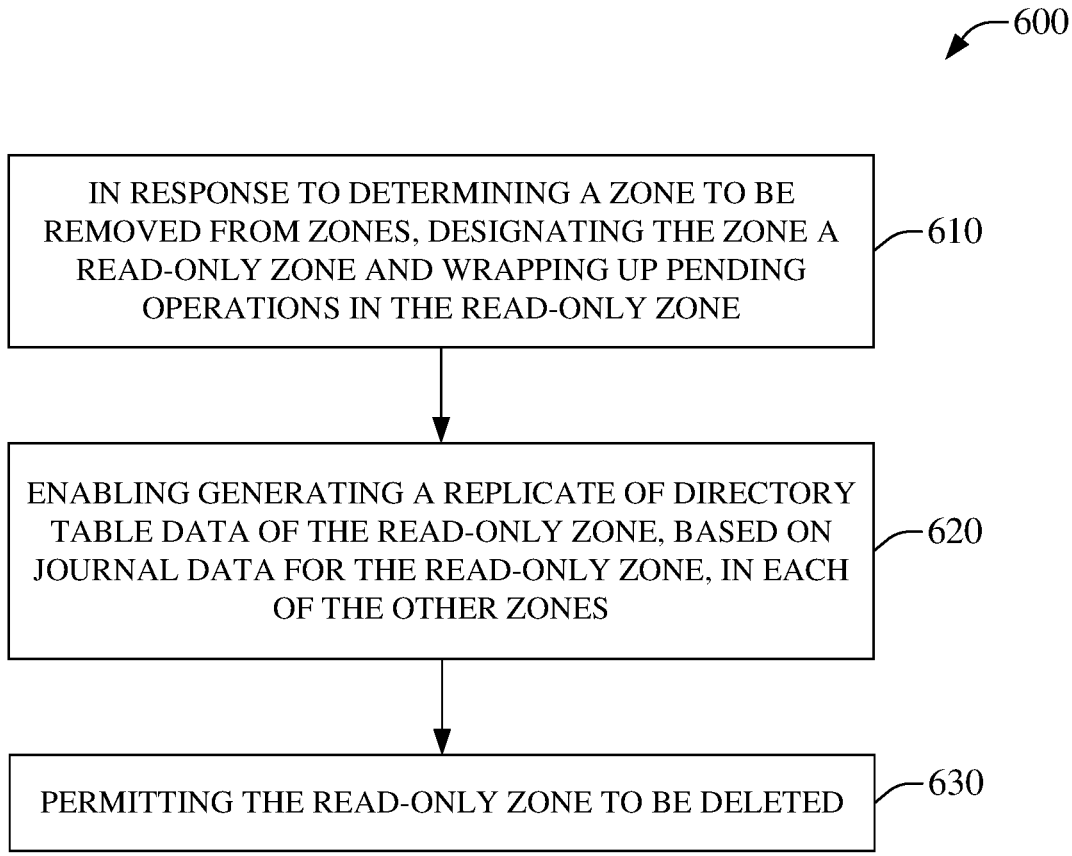
FIG. 6 is an illustration of an example method that can facilitate preserving data during scaling-in of a geographically diverse storage system, in accordance with aspects of the subject disclosure.
Figure 7:
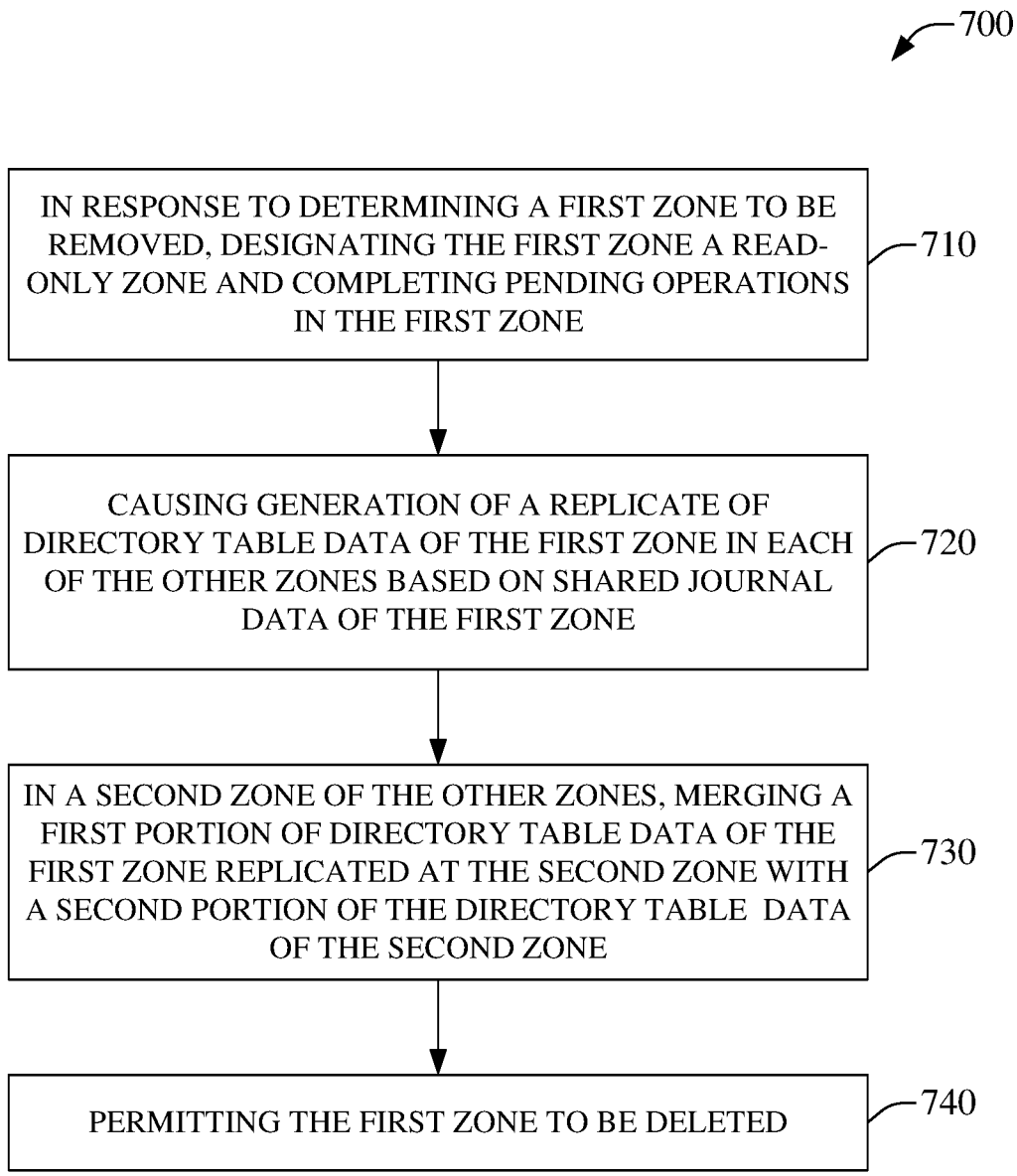
FIG. 7 is an illustration of an example method facilitating preserving data, via replication and merging of data, during scaling-in of a geographically diverse storage system, in accordance with aspects of the subject disclosure.
Figure 8:
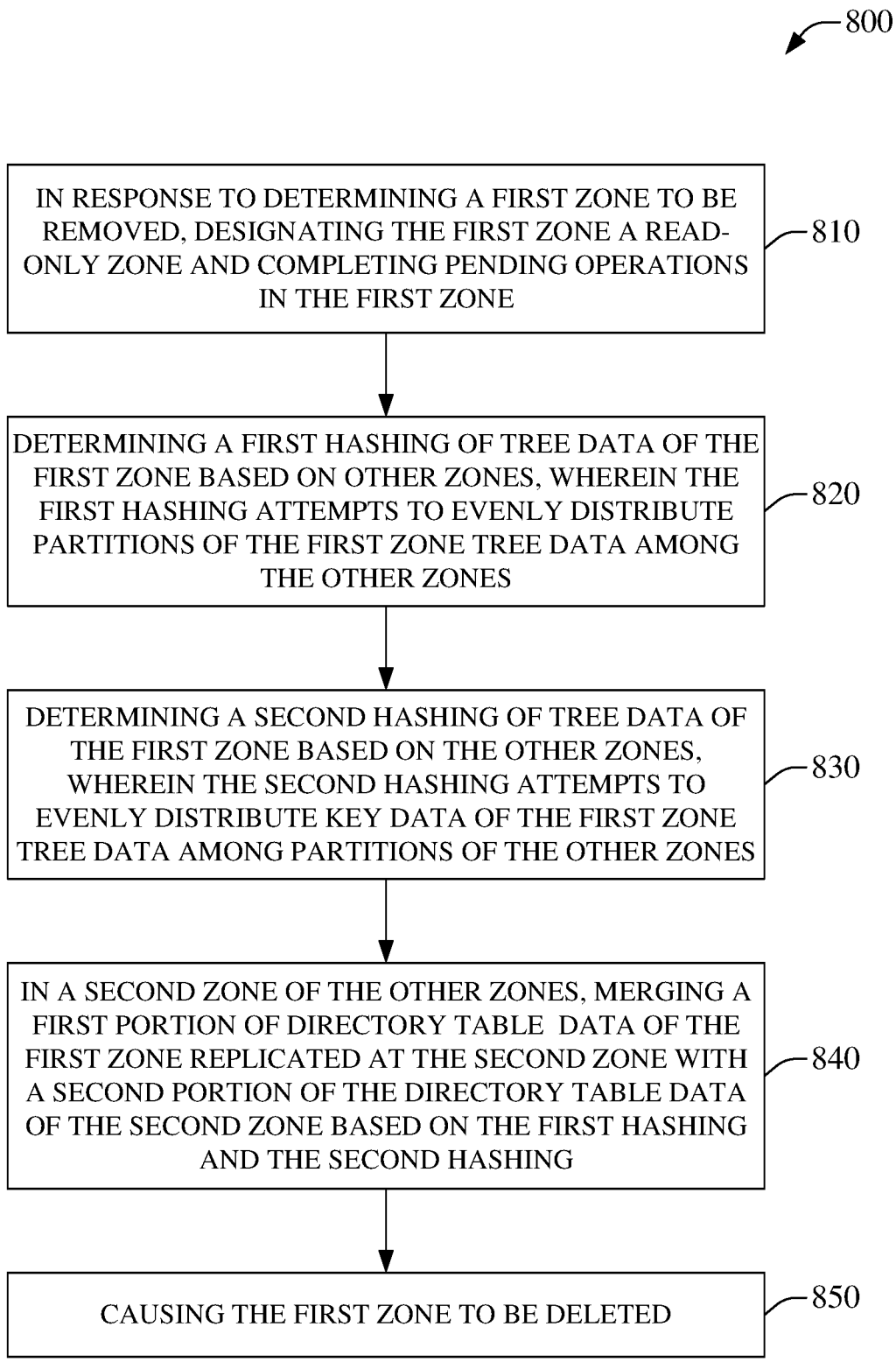
FIG. 8 illustrates an example method that enables preserving, via merging of data based on a first and a second hashing function, data during scaling of in a geographically diverse storage system, in accordance with aspects of the subject disclosure.

In view of the example system(s) described above, example method(s) that can be implemented in accordance with the disclosed subject matter can be better appreciated with reference to flowcharts in FIG. 6-FIG. 8. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIG. 6 is an illustration of an example method 600 that can facilitate preserving data during scaling-in of a geographically diverse storage system, in accordance with aspects of the subject disclosure. Method 600, at 610, can comprise designating a zone of a geographically diverse data storage system as read only (RO). The RO designation can be in response to determining that the zone is to be removed for the zones comprising the geographically diverse data storage system. Scaling-in, e.g., removing a zone from a geographically diverse data storage system can result in loss of access to data of the zone to be removed in conventional techniques that remove the zone to cause recovery of data at other zones based on previously replicated data. In contrast, the presently disclosed scaling technique(s) allow for continued access to data on the zone to be removed. In an aspect, the RO zone can be restricted from receiving additional data for storage in the zone while still allowing access to data already stored in the RO zone. Moreover, data can be read from the RO zone to facilitate replication of up-to-date RO zone data at other zones, such that when the RO zone is removed from the geographically diver data storage system, the replicated data can be relied on as accurate and complete. This can be an improvement over recovered data in conventional techniques that can be incomplete, out-of-date, etc.

At 620, method 600 can comprise enabling generating of DT data of the RO zone in each of the other zones of the geographically diverse data storage system. The generation of replicate DT data can be based on journal data for the RO zone. In an embodiment, the RO zone can complete queued events, operations, etc., which can include updating a tree data structure of partitions comprising data representing the DT. As such, allowing the RO zone to update the tree data based on journal data representative of changes to metadata stored in DTs can result in an up-to-date tree chunk that can then be replicated at other zones of the geographically diverse data storage system. This, in turn, results in the other zones having up-to-date DT data. As noted, the this technique can avoid the other zone, according to conventional techniques, rebuilding DT data from previously copied tree data and previously copied journal data that can result in incomplete, out-of-date, etc., DT data. In some embodiments, the updated tree data of the RO zone can be based on an effective state stored in volatile memory that could also be reflected in journal data of a journal chunk of the RO zone.

At 630, the RO zone can be deleted. At his point method 600 can end. In an aspect, upon replication of the DT data into other zones of the geographically diverse data storage system, the replication of the RO zone can be complete and the data of the RO zone can be represented in other zones of the geographically diverse data storage system, which can enable deletion, release, etc., of the RO zone without loss of access to data, data previously stored in the RO zone, via other zones of the geographically diverse data storage system.

FIG. 7 is an illustration of an example method 700, facilitating preserving data, via replication and merging of data, during scaling-in of a geographically diverse storage system, in accordance with aspects of the subject disclosure. At 710, method 700 can comprise designating a first zone of a geographically diverse data storage system as RO. The RO designation can be in response to determining that the first zone is to be removed from the zones comprising the geographically diverse data storage system. Scaling-in, e.g., removing a zone from a geographically diverse data storage system can result in loss of access to data of the zone to be removed in conventional techniques that remove the zone to trigger recovery of data of the removed zone at other zones based on previously replicated data. In contrast, the presently disclosed scaling technique(s) allow for continued access to data on the zone to be removed, e.g., the first zone. In an aspect, the first zone can be restricted, after being set as RO, from receiving additional data for storage in the first zone while still allowing access to data already stored in the first zone. Moreover, data can be read from the first zone to facilitate replication of up-to-date first zone data at other zones, such that when the first zone is subsequently removed from the geographically diver data storage system, the replicated data at the other zones can be relied on as accurate and complete. This can be an improvement over recovered data in conventional techniques that can be incomplete, out-of-date, etc. At 710, method 700 can further comprise completing pending operations at the first zone, which is now the RO zone. In an embodiment, completing the pending operations can comprise updating a tree-like or tree structure of partitions comprising data representing a DT of the first zone.

At 720, method 700 can comprise causing generation of a replicate of DT data of the first zone in each of the other zones of the geographically diverse data storage system. The generation of replicate DT data can be based on journal data for the first zone. In an embodiment, where the first zone has complete queued events, operations, etc., which can include updating a tree data structure of partitions comprising data representing the DT, the corresponding up-to-date tree data can then be replicated at other zones of the geographically diverse data storage system. This, in turn, can result in the other zones having up-to-date DT data.

Method 700, at 730, can comprise merging a first portion of DT data of the first zone with a second portion of DT data of a second zone of the geographically diverse data storage system. In an embodiment, the portions can be determined according to a first 'horizontal' hashing function. Merging of the DT data can reduce the amount of space consumed to preserve replicated data by including the replicated data in partitions of the second zone rather than maintaining separate copies of the first zone DT data in the second (and other) zones. However, this merging can also result in uneven spreading of keys corresponding to the merged data.

At 740, the RO zone can be deleted. At his point method 700 can end. In an aspect, upon replication of the DT data into other zones of the geographically diverse data storage system, the replication of the RO zone can be complete and the data of the RO zone can be represented in other zones of the geographically diverse data storage system, which can enable deletion, release, etc., of the RO zone without loss of access to data, data previously stored in the RO zone, via other zones of the geographically diverse data storage system. Moreover, the merging can reduce the consumption of computing resources, including used storage space in the other zones, in contrast to maintaining full copies of DT data in tree chunks replicated into the other zones.

FIG. 8 is an illustration of an example method 800, which can enable preserving, via merging of data based on a first hashing function and a second hashing function, data during scaling of in a geographically diverse storage system, in accordance with aspects of the subject disclosure. At 810, method 800 can comprise designating a first zone of a geographically diverse data storage system as RO and completing pending operations in the first zone. The RO designation can be in response to determining that the first zone is to be removed from the zones comprising the geographically diverse data storage system. Scaling-in, e.g., removing a zone from a geographically diverse data storage system can result in loss of access to data of the zone to be removed in conventional techniques that remove the zone to trigger recovery of data of the removed zone at other zones based on previously replicated data. In an embodiment, completing the pending operations can comprise updating a tree data structure of partitions comprising data representing a DT of the first zone.

At 820, method 800 can comprise determining a first hashing of tree data of the first zone based on other zones. The first hashing can attempt to evenly distribute partitions of the first zone tree data among the other zones. This can be termed 'horizontal' hashing. Additionally, at 830, method 800 can determine a second hashing, e.g., a 'vertical' hashing, based on the other zones. The vertical hashing can attempts to evenly distribute key data of the first zone tree data among partitions of the other zones.

At 840, method 800 can comprise merging a first portion of DT data of the first zone with a second portion of DT data of a second zone of the geographically diverse data storage system based on the first hashing and the second hashing. In an embodiment, the portions can be determined according to a first 'horizontal' hashing function while the distribution of corresponding keys can be according to a second 'vertical' hashing function. Merging, according based on the horizontal hashing of the DT data can reduce the amount of space consumed to preserve replicated data by including the replicated data in partitions of the second zone rather than maintaining separate copies of the first zone DT data in the second (and other) zones. Further, the merging, also according to the vertical hashing, can result is a more even distribution of keys corresponding to the merged data among the portions of each zone.

At 850, method 800 can cause the first zone to be deleted. At his point method 800 can end. In an aspect, upon replication of the DT data into other zones of the geographically diverse data storage system, the replication of the RO zone can be complete and the data of the RO zone can be represented in other zones of the geographically diverse data storage system, which can enable deletion, release, etc., of the RO zone without loss of access to data, data previously stored in the RO zone, via other zones of the geographically diverse data storage system. Moreover, the merging according to both a horizontal hashing function and a vertical hashing function can reduce the consumption of computing resources while reasonably distributing keys adopted among the partitions.

Figure 9:
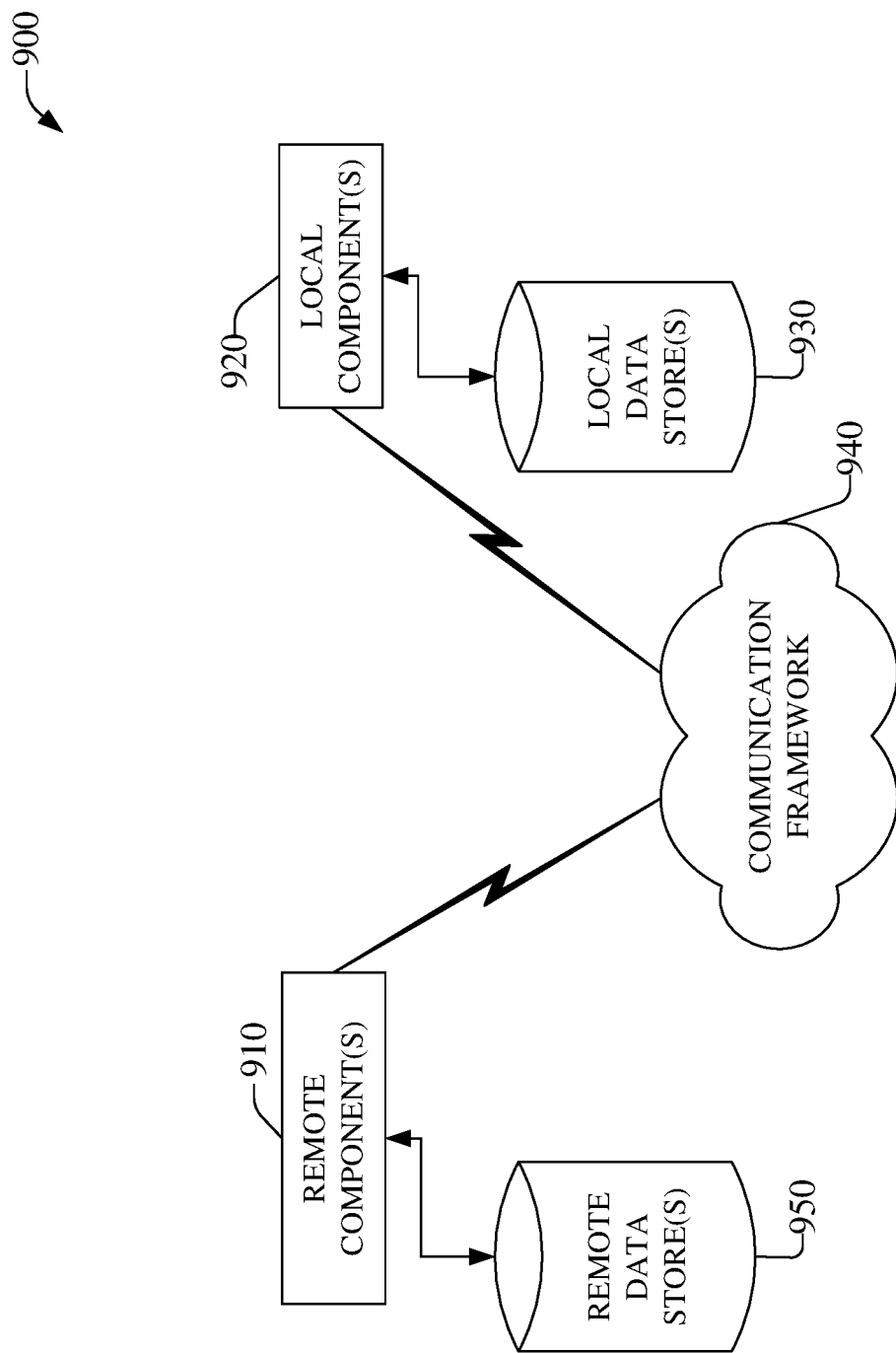
FIG. 9 depicts an example schematic block diagram of a computing environment with which the disclosed subject matter can interact.

FIG. 9 is a schematic block diagram of a computing environment 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can be a remotely located ZSC connected to a local ZSC via communication framework, e.g., communication framework 102, 202, 940, etc. Communication framework 940 can comprise wired network devices, wireless network devices, mobile devices, wearable devices, radio access network devices, gateway devices, femtocell devices, servers, etc. In an aspect the remotely located ZSC can be embodied in ZSC 110, 120, 130, 210, etc.

The system 900 also comprises one or more local component(s) 920. The local component(s) 920 can be hardware and/or software (e.g., threads, processes, computing devices). In some embodiments, local component(s) 920 can comprise a local ZSC connected to a remote ZSC via communication framework 940. In an aspect the local ZSC can be embodied in ZSC 110, 120, 130, 210, etc.

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940. As examples, information corresponding to chunks stored on ZSCs can be communicated via communication framework 940 to other ZSCs of a storage network, e.g., to facilitate determining horizontal and/or vertical hashing functions, replicating DT data/chunks, journal data/chunks, tree data/chunks, etc., as disclosed herein.

Figure 10:
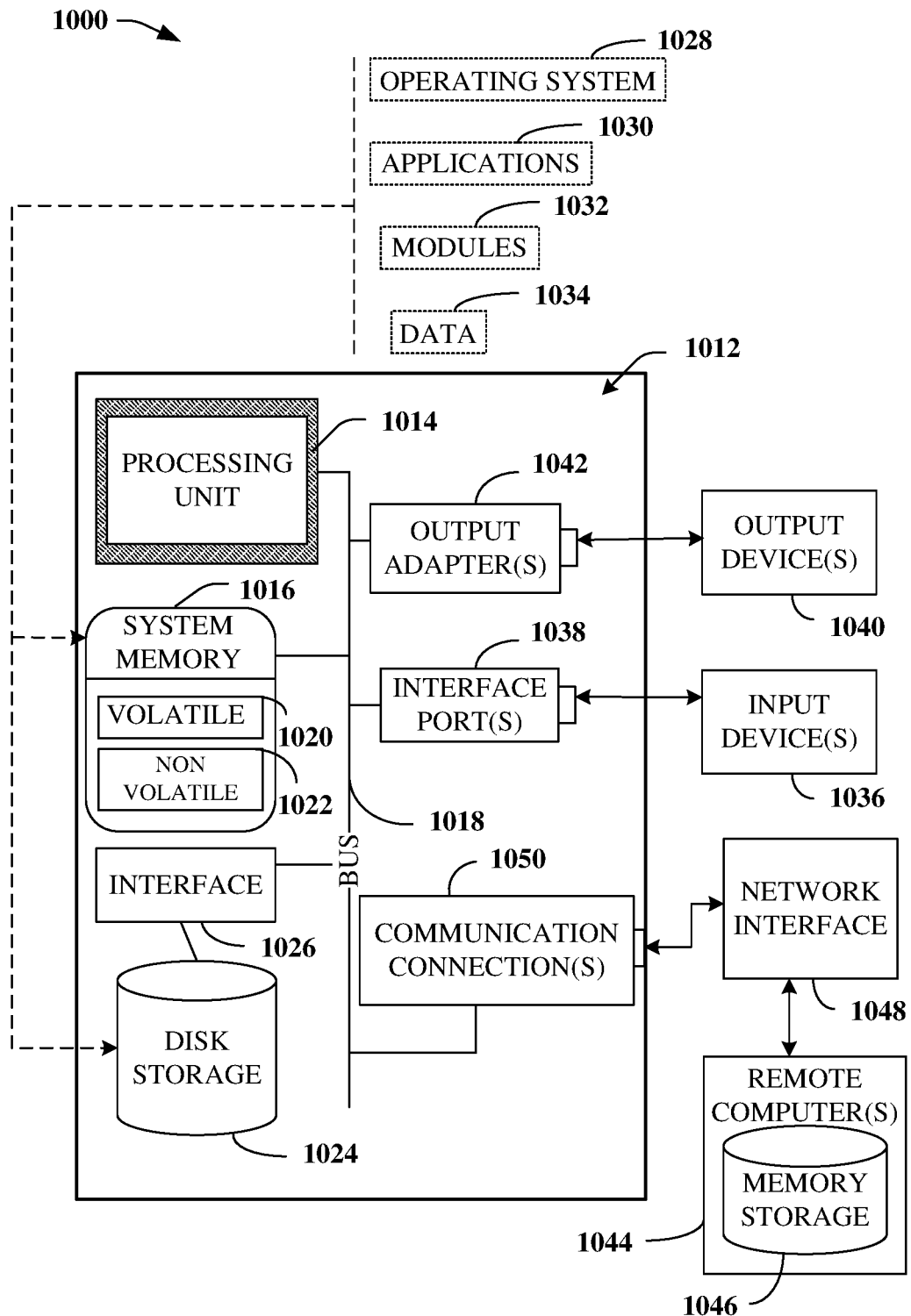
FIG. 10 illustrates an example block diagram of a computing system operable to execute the disclosed systems and methods in accordance with an embodiment.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 1020 (see below), nonvolatile memory 1022 (see below), disk storage 1024 (see below), and memory storage 1046 (see below). Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, SynchLink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 10 illustrates a block diagram of a computing system 1000 operable to execute the disclosed systems and methods in accordance with an embodiment. Computer 1012, which can be, for example, comprised in a ZSC 110, 120, 130, 210, etc., scaling component 118,128, 138, 218, 228, 238, 248, 318, 328, 338, etc., or in other components disclosed herein, can comprise a processing unit 1014, a system memory 1016, and a system bus 1018. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture, microchannel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 1016 can comprise volatile memory 1020 and nonvolatile memory 1022. A basic input/output system, containing routines to transfer information between elements within computer 1012, such as during start-up, can be stored in nonvolatile memory 1022. By way of illustration, and not limitation, nonvolatile memory 1022 can comprise read only memory, programmable read only memory, electrically programmable read only memory, electrically erasable read only memory, or flash memory. Volatile memory 1020 comprises read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, SynchLink dynamic read only memory, Rambus direct read only memory, direct Rambus dynamic read only memory, and Rambus dynamic read only memory.

Computer 1012 can also comprise removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, flash memory card, or memory stick. In addition, disk storage 1024 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage devices 1024 to system bus 1018, a removable or non-removable interface is typically used, such as interface 1026.

Computing devices typically comprise a variety of media, which can comprise computer-readable storage media or communications media, which two terms are used herein differently from one another as follows.

Computer-readable storage media can be any available storage media that can be accessed by the computer and comprises both volatile and nonvolatile media, removable and non-removable media. By way of example, and not limitation, computer-readable storage media can be implemented in any method or technology for storage of information such as computer-readable instructions, program modules, structured data, or unstructured data. Computer-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium. As such, for example, a computer-readable medium can comprise executable instructions stored thereon that, in response to execution, can cause a system comprising a processor to perform operations, comprising causing a first ZSC to enter a read-only mode, complete operations queued prior to entering the read-only mode, update a data chunk comprising directory table data stored in a tree data structure, determine a first portion of the data chunk and a second portion of the data chunk based on a first hash function related to distributing the portions of the data chunk to other ZSCs, communicate the first portion and the second portion to other ZSCs, and remove the first ZSC from the geographically diverse data storage system, as is disclosed herein.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be noted that the disclosed subject matter can be implemented with various operating systems or combinations of operating systems.

A user can enter commands or information into computer 1012 through input device(s) 1036. In some embodiments, a user interface can allow entry of user preference information, etc., and can be embodied in a touch sensitive display panel, a mouse/pointer input to a graphical user interface (GUI), a command line controlled interface, etc., allowing a user to interact with computer 1012. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1014 through system bus 1018 by way of interface port(s) 1038. Interface port(s) 1038 comprise, for example, a serial port, a parallel port, a game port, a universal serial bus, an infrared port, a Bluetooth port, an IP port, or a logical port associated with a wireless service, etc. Output device(s) 1040 use some of the same type of ports as input device(s) 1036.

Thus, for example, a universal serial busport can be used to provide input to computer 1012 and to output information from computer 1012 to an output device 1040. Output adapter 1042 is provided to illustrate that there are some output devices 1040 like monitors, speakers, and printers, among other output devices 1040, which use special adapters. Output adapters 1042 comprise, by way of illustration and not limitation, video and sound cards that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, cloud storage, a cloud service, code executing in a cloud-computing environment, a workstation, a microprocessor-based appliance, a peer device, or other common network node and the like, and typically comprises many or all of the elements described relative to computer 1012. A cloud computing environment, the cloud, or other similar terms can refer to computing that can share processing resources and data to one or more computer and/or other device(s) on an as needed basis to enable access to a shared pool of configurable computing resources that can be provisioned and released readily. Cloud computing and storage solutions can store and/or process data in third-party data centers which can leverage an economy of scale and can view accessing computing resources via a cloud service in a manner similar to a subscribing to an electric utility to access electrical energy, a telephone utility to access telephonic services, etc.

For purposes of brevity, only a memory storage device 1046 is illustrated with remote computer(s) 1044. Remote computer(s) 1044 is logically connected to computer 1012 through a network interface 1048 and then physically connected by way of communication connection 1050. Network interface 1048 encompasses wire and/or wireless communication networks such as local area networks and wide area networks. Local area network technologies comprise fiber distributed data interface, copper distributed data interface, Ethernet, Token Ring and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. Moreover, the use of any particular embodiment or example in the present disclosure should not be treated as exclusive of any other particular embodiment or example, unless expressly indicated as such, e.g., a first embodiment that has aspect A and a second embodiment that has aspect B does not preclude a third embodiment that has aspect A and aspect B. The use of granular examples and embodiments is intended to simplify understanding of certain features, aspects, etc., of the disclosed subject matter and is not intended to limit the disclosure to said granular instances of the disclosed subject matter or to illustrate that combinations of embodiments of the disclosed subject matter were not contemplated at the time of actual or constructive reduction to practice.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities, machine learning components, or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks comprise broadcast technologies (e.g., sub-Hertz, extremely low frequency, very low frequency, low frequency, medium frequency, high frequency, very high frequency, ultra-high frequency, super-high frequency, extremely high frequency, terahertz broadcasts, etc.); Ethernet; X.25; powerline-type networking, e.g., Powerline audio video Ethernet, etc.; femtocell technology; Wi-Fi; worldwide interoperability for microwave access; enhanced general packet radio service; second generation partnership project (2G or 2GPP); third generation partnership project (3G or 3GPP); fourth generation partnership project (4G or 4GPP); long term evolution (LTE); fifth generation partnership project (5G or 5GPP); third generation partnership project universal mobile telecommunications system; third generation partnership project 2; ultra mobile broadband; high speed packet access; high speed downlink packet access; high speed uplink packet access; enhanced data rates for global system for mobile communication evolution radio access network; universal mobile telecommunications system terrestrial radio access network; or long term evolution advanced. As an example, a millimeter wave broadcast technology can employ electromagnetic waves in the frequency spectrum from about 30 GHz to about 300 GHz. These millimeter waves can be generally situated between microwaves (from about 1 GHz to about 30 GHz) and infrared (IR) waves, and are sometimes referred to extremely high frequency (EHF). The wavelength ($\lambda$) for millimeter waves is typically in the 1-mm to 10-mm range.

The term "infer" or "inference" can generally refer to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference, for example, can be employed to identify a specific context or action, or can generate a probability distribution over states of interest based on a consideration of data and events. Inference can also refer to techniques employed for composing higher-level events from a set of events and/or data. Such inference results in the construction of new events or actions from a set of observed events and/or stored event data, whether the events, in some instances, can be correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
a processor; and
a memory that stores executable instructions that, when executed by the processor, facilitate performance of operations, comprising:
designating, in response to receiving an indication that a geographically diverse data storage system will be scaled-in, a first zone storage component of the geographically diverse data storage system as read-only;
in response to determining that the first zone storage component has completed queued operations and updated a data chunk, causing replication of at least a first portion of the data chunk at a second zone storage component of the geographically diverse data storage system; and
in response to determining that at least the first portion of the data chunk has been replicated at the second zone storage component, removing the first zone storage component from the geographically diverse data storage system.

2. The system of claim 1, wherein the causing of the replication of at least the first portion of the data chunk further causes replication of at least a second portion of the data chunk at a third zone storage component of the geographically diverse data storage system.

3. The system of claim 1, wherein at least the first portion of the data chunk is determined by a first hash function.

4. The system of claim 3, wherein at least the first portion of the data chunk, based on the first hash function, is less than all of the data chunk, wherein the first portion of the data chunk is merged with first data of the second zone storage component, and wherein the first portion and the first data being merged results in the first data of the second zone storage component adopting all key data of the first portion of the data chunk.

5. The system of claim 1, wherein at least the first portion of the data chunk is determined by a first hash function and by a second hash function that is a different hash function than the first hash function.

6. The system of claim 5, wherein at least the first portion of the data chunk, based on the first hash function, is less than all of the data chunk, wherein the first portion of the data chunk is merged with first data of the second zone storage component, and wherein the first portion and the first data being merged results in the first data of the second zone storage component adopting less than all of the key data of the first portion of the data chunk in accord with the second hash function.

7. The system of claim 5, wherein other zone storage components of the geographically diverse data storage system comprise at least the second zone storage component and a third zone storage component, and wherein merging at least the first portion of the data chunk with data of the other zone storage components, based on the first hash function and the second hash function, results in a more even distribution of key data adoption in the other zone storage components than would be achieved by merging at least the first portion of the data chunk with the data of the other zone storage components based on only the first hash function.

8. The system of claim 1, wherein the data chunk comprises directory table data.

9. The system of claim 8, wherein the directory table data is stored in a tree data structure scheme.

10. The system of claim 1, wherein the causing of the replication of at least the first portion of the data chunk at the second zone storage component of the geographically diverse data storage system results in preserving the data represented in the data chunk without causing the second zone storage component to rebuild the data chunk from a previously stored out-of-date version of the data chunk and journal data indicating changes to the previously stored out-of-date version of the data chunk.

11. The system of claim 1, wherein the first zone storage component is located in a different geographical region than the second zone storage component.

12. A method, comprising:
in response to receiving an indication that a geographically diverse data storage system will be scaled-in, altering, by a system comprising a processor and a memory, a state of a first zone storage component of the geographically diverse data storage system to prevent the first zone storage component from receiving additional data for storage by the first zone storage component;
instructing, by the system, the first zone storage component to complete already queued operations and to update a data chunk comprising data stored according to a tree data structure scheme;
directing, by the system, replication of at least a first portion of the data chunk at a second zone storage component of the geographically diverse data storage system; and
in response to determining that at least the first portion of the data chunk has been replicated at the second zone storage component, removing, by the system, the first zone storage component from the geographically diverse data storage system.

13. The method of claim 12, wherein the directing the replication results in the replication of at least the first portion of the data chunk at the second zone storage component in a different geographical location than the first zone storage component.

14. The method of claim 12, wherein the directing the replication of at least the first portion of the data chunk further causes replication of at least a second portion of the data chunk at a third zone storage component of the geographically diverse data storage system, and wherein the third zone storage component is located at a different geographical location than either the first zone storage component or the second zone storage component.

15. The method of claim 12, wherein the directing the replication of at least the first portion of the data chunk at the second zone storage component is based on a horizontal hash function related to distributing at least the first portion of the data chunk among other zone storage components of the geographically diverse data storage system comprising the second zone storage component.

16. The method of claim 15, wherein the directing the replication of at least the first portion of the data chunk at the second zone storage component is based on:
a horizontal hash function related to distributing at least the first portion of the data chunk among other zone storage components of the geographically diverse data storage system, wherein the other zone storage components comprise the second zone storage component, and
a vertical hash function related to distributing key data values among data partitions occurring within each of the other zone storage components, wherein the key data values correspond to at least the first portion of the data chunk.

17. A first zone storage component of the geographically diverse data storage system, comprising:
a processor; and
a memory that stores executable instructions that, when executed by the processor, facilitate performance of operations, comprising:
in response to receiving an indication that a geographically diverse data storage system will be scaled-in, entering a read-only mode that restricts the first zone storage component from receiving additional data for storage by the first zone storage component;
completing operations, wherein the operations were queued prior to entering the read-only mode;
updating a data chunk comprising directory table data stored in a tree data structure;
determining a first portion of the data chunk and a second portion of the data chunk, wherein the determining is based on a first hash function related to distributing portions of the data chunk to other zone storage components of the geographically diverse data storage system, wherein the other zone storage components comprise a second zone storage component and a third zone storage component;
communicating the first portion of the data chunk to the second zone storage component and communicating the second portion of the data chunk to the third zone storage component; and
removing the first zone storage component from the geographically diverse data storage system.

18. The first zone storage component of claim 17, wherein the communicating the first portion of the data chunk to the second zone storage component enables the first portion of the data chunk to be merged with data of the second zone storage component such that key data values are adopted by the data of the second zone storage component after being merged with the first portion of the data chunk.

19. The first zone storage component of claim 17, wherein key data values corresponding to the first portion of the data chunk are determined based on a second hash function related to distributing key data values among the portions of the data chunk communicated to the other zone storage components, and wherein the portions of the data chunk comprise the first portion and the second portion of the data chunk.

20. The first zone storage component of claim 19, wherein the communicating the first portion of the data chunk to the second zone storage component enables the first portion of the data chunk to be merged with data of the second zone storage component such that the key data values based on the second hash function are adopted by the data of the second zone storage component after being merged with the first portion of the data chunk.

\* \* \* \* \*